United States Patent
Feltgen et al.

(10) Patent No.: US 8,190,111 B2
(45) Date of Patent: *May 29, 2012

(54) TWO-POINT POLAR MODULATOR AND METHOD FOR GENERATING A POLAR-MODULATED SIGNAL BASED ON AMPLITUDE INFORMATION AND PHASE INFORMATION

(75) Inventors: Michael Feltgen, Krefeld (DE); Giuseppe Li Puma, Bochum (DE)

(73) Assignee: Intel Mobile Communications GmbH, Neubiberg (DE)

( * ) Notice: Subject to any disclaimer, the term of this patent is extended or adjusted under 35 U.S.C. 154(b) by 359 days.

This patent is subject to a terminal disclaimer.

(21) Appl. No.: 12/431,673

(22) Filed: Apr. 28, 2009

(65) Prior Publication Data

US 2009/0275358 A1    Nov. 5, 2009

(30) Foreign Application Priority Data

May 2, 2008  (DE) .......................... 10 2008 021 877

(51) Int. Cl.
    *H04B 1/18*    (2006.01)
(52) U.S. Cl. ................ 455/180.3; 455/108; 455/102; 455/110
(58) Field of Classification Search .......... 455/102, 455/108, 110, 118, 180.3
    See application file for complete search history.

(56) References Cited

U.S. PATENT DOCUMENTS

| | | |
|---|---|---|
| 2005/0285688 A1 | 12/2005 | Hirano et al. |
| 2009/0275359 A1* | 11/2009 | Puma et al. ................ 455/550.1 |
| 2010/0272222 A1* | 10/2010 | Mitani et al. ................... 375/376 |

FOREIGN PATENT DOCUMENTS

| | | |
|---|---|---|
| EP | 1819059 A1 | 8/2007 |
| WO | WO 2007083635 A1 * | 7/2007 |

OTHER PUBLICATIONS

GermanOfficeActio, Apr. 23, 2009, Infineon Technologies AG.

* cited by examiner

*Primary Examiner* — Lincoln Donovan
*Assistant Examiner* — Shikha Goyal
(74) *Attorney, Agent, or Firm* — Eschweiler & Associates, LLC

(57) ABSTRACT

A two-point polar modulator for generating a polar-modulated signal based on an amplitude information and a phase information includes a two-point modulation phase-locked loop which is implemented to enable a frequency setting depending on a first control value via a feedback path of the two-point modulation phase-locked loop and to enable a frequency setting depending on a second control value, directly, bypassing the feedback path, wherein the two-point modulation phase-locked loop is implemented to provide a phase-locked loop output signal depending on the two control values. The two-point polar modulator further includes a modulator which is implemented to combine an amplitude signal derived from the amplitude information with the phase-locked loop output signal, to generate the polar-modulated signal and a control value generator which is implemented to generate the first control value depending on the phase information and independent of the amplitude information and which is implemented to generate the second control value depending on the amplitude information.

31 Claims, 15 Drawing Sheets

TWO-POINT POLAR MODULATOR AND METHOD FOR GENERATING A POLAR-MODULATED SIGNAL BASED ON AMPLITUDE INFORMATION AND PHASE INFORMATION

CROSS-REFERENCE TO RELATED APPLICATIONS

This application claims priority from German Patent Application No. 102008021877.4-31, which was filed on May 2, 2008, and is incorporated herein in its entirety by reference.

BACKGROUND OF THE INVENTION

Embodiments according to the invention relate to a two-point polar modulator, i.e. a polar modulator having a two-point phase-locked loop. Some embodiments relate to a two-point modulator which may be used in mobile radio telephones which utilize modulation methods with a non-constant envelope for increasing the data rate, e.g. according to the mobile radio standard GSM-EDGE (GSM=global system for mobile communication; EDGE=enhanced data rate for GSM evolution).

With the rapidly progressing development on the mobile radio market, the development of power-efficient wireless transmit/receive architectures has become an important point for the design of portable mobile devices. Mobile radio telephones of the next generation which utilize the GSM-EDGE standard for example use modulation methods with a non-constant envelope for achieving higher data rates. The manufacturers of cellular mobile radio telephones in some case request similar talk and standby times for the GSM standard of the next generation. In order to fulfill this request, or at least to make a contribution to the same, power-efficient radio transmission architectures are required.

In the latest generation of transceivers, a polar modulator concept is being used more and more the advantage of which is its robustness against parasitic couplings of the power amplifier output signal into the phase-locked loop of the polar modulator. This concept has already proved successful for GSM-GPRS systems (GPRS=general packet radio service). For EDGE systems, however, the coupling of the output signal into the voltage-controlled oscillator (VCO) of the phase-locked loop (PLL) sometimes causes the generation of unwanted AM-FM signal components (AM=amplitude modulation, FM=frequency modulation) which become noticeable with an interference of the FM signal at the output of the VCO. The unwanted AM/FM signal components lead to a significant deterioration of the modulation spectrum and increase error performance. Partially, by this the tolerance mask of the frequency spectrum may be violated with GSM-EDGE modulations.

In order to reduce the influence of the parasitic coupling path of the output signal of the power output stage with GSM-EDGE modulation methods, suitable measures at the polar modulator are desired which prevent such a coupling of the output signal, and compensate or at least suppress the same.

SUMMARY

Some embodiments according to the invention provide a two-point polar modulator and a method for generating a polar-modulated signal based on amplitude information and phase information. The two-point polar modulator includes, for example, a two-point modulation phase-locked loop to set a frequency depending on a first control value, to set the frequency via a feedback path of the two-point phase-locked loop and, and depending on a second control value, to set the frequency directly bypassing the feedback path, wherein the two-point phase-locked loop is implemented to provide a phase-locked loop output signal depending on the two control values. The two-point polar modulator further includes a modulation means for combining an amplitude signal derived from the amplitude information with the phase-locked loop output signal to generate the polar-modulated signal. Further, the two-point polar modulator includes a control value generator which is implemented to generate the first control value depending only on the phase information, and which is implemented to generate the second control value depending on the amplitude information.

BRIEF DESCRIPTION OF THE DRAWINGS

In the following, embodiments according to the invention are explained in more detail with reference to the accompanying drawings, in which:

FIG. 9a shows a characteristic frequency spectrum of the frequency-modulated pure carrier signal of FIG. 8a;

DETAILED DESCRIPTION OF THE INVENTION

Figure 1:
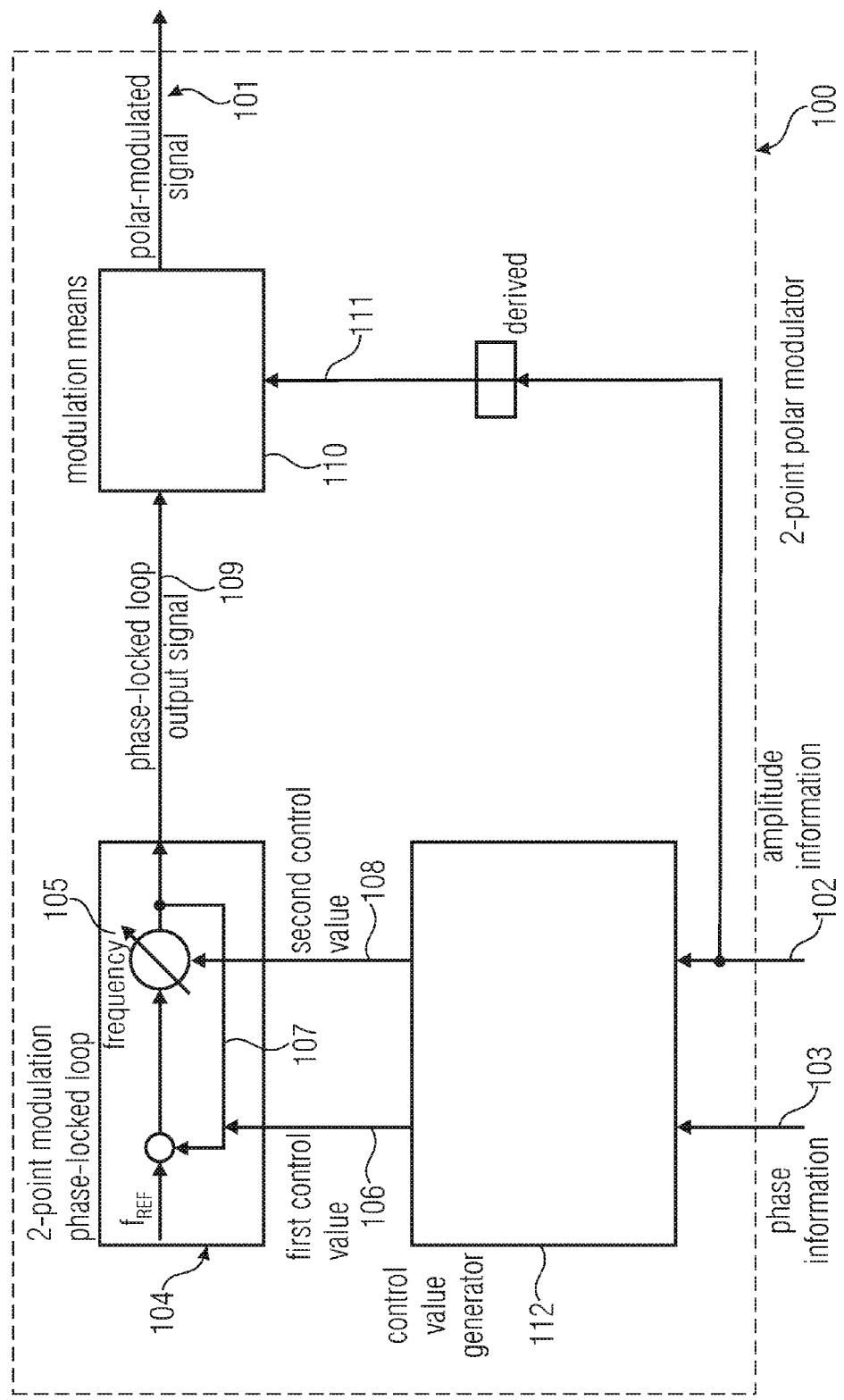
FIG. 1 shows a block diagram of a two-point polar modulator according to an embodiment of the invention.

In the following, with reference to the accompanying FIGS. 1 to 11, embodiments of a two-point polar modulator and a method for generating a polar-modulated signal are explained in detail.

With reference to the following description of the embodiments according to the present invention, it is to be noted that, in the figures and in the description, the same reference numerals are used for functionally identical or, respectively, seemingly like or equivalent elements for reasons of clarity.

With reference to FIG. 1, in which a block diagram of a two-point polar modulator according to an embodiment of the invention is illustrated, the functioning of a two-point polar modulator is described. A two-point polar modulator 100 for generating a polar-modulated signal 101 based on amplitude information 102 and phase information 103 includes a two-point modulation phase-locked loop 104 for setting a frequency 105 depending on a first control value 106 to set the frequency 105 via a feedback path 107 of the two-point modulation phase-locked loop 104 and depending on a second control value 108 to set the frequency 105 directly bypassing the feedback path 107. The two-point modulation phase-locked loop 104, according to an embodiment of the invention, here provides a phase-locked loop output signal 109 depending on the two control values 106, 108. The two-point polar modulator 100 further includes a modulation means 110 for combining an amplitude signal 111 derived from the amplitude information 102 with the phase-locked loop output signal 109 in order to generate the polar-modulated signal 101. Further, the two-point polar modulator 100 includes a control value generator 112 which is implemented to generate the first control value 106 only depending on the phase information 103, i.e., for example, independent of the amplitude information, and which is implemented to generate the second control value 108 depending on the amplitude information 102.

The second control value 108 may, for example, be generated depending on a signal amp(t) corresponding to the amplitude information 102. Alternatively, the second control value 108 may be generated depending on a signal y(t) based on the amplitude information 102. For example, a signal y(t)=func/amp(t)) generated from the signal corresponding to the amplitude information using a linear or non-linear function f(..). For example, the linear function may correspond to an amplification. The non-linear function may, for example, be a Taylor series or a power series, e.g. a function of the following form $$y(t)=\Sigma_n K_n (\text{amp}(t))^{n/k}.$$

For a transmitter concept having an RF oscillator (RF=radio frequency) which is based on double the terminal frequency, for example the three cases described in the following may be used:
1. y(t)=K1*amp(t),
2. y(t)=K2*amp(t)$^2$,
3. y(t)=K1*amp(t)+y(t)=K2*amp(t)$^2$.

For a transmitter concept having an RF oscillator which is based on four times the terminal frequency, the signal y(t) may, for example, be generated as follows:
4. y(t)=K1*amp(t)$^4$.

Embodiments according to the invention according to FIG. 1 thus further include signal values y(t) based on the amplitude information 102, formed by means of a non-linear predistortion of the signal amp(t) corresponding to the amplitude information 102.

Figure 2A:
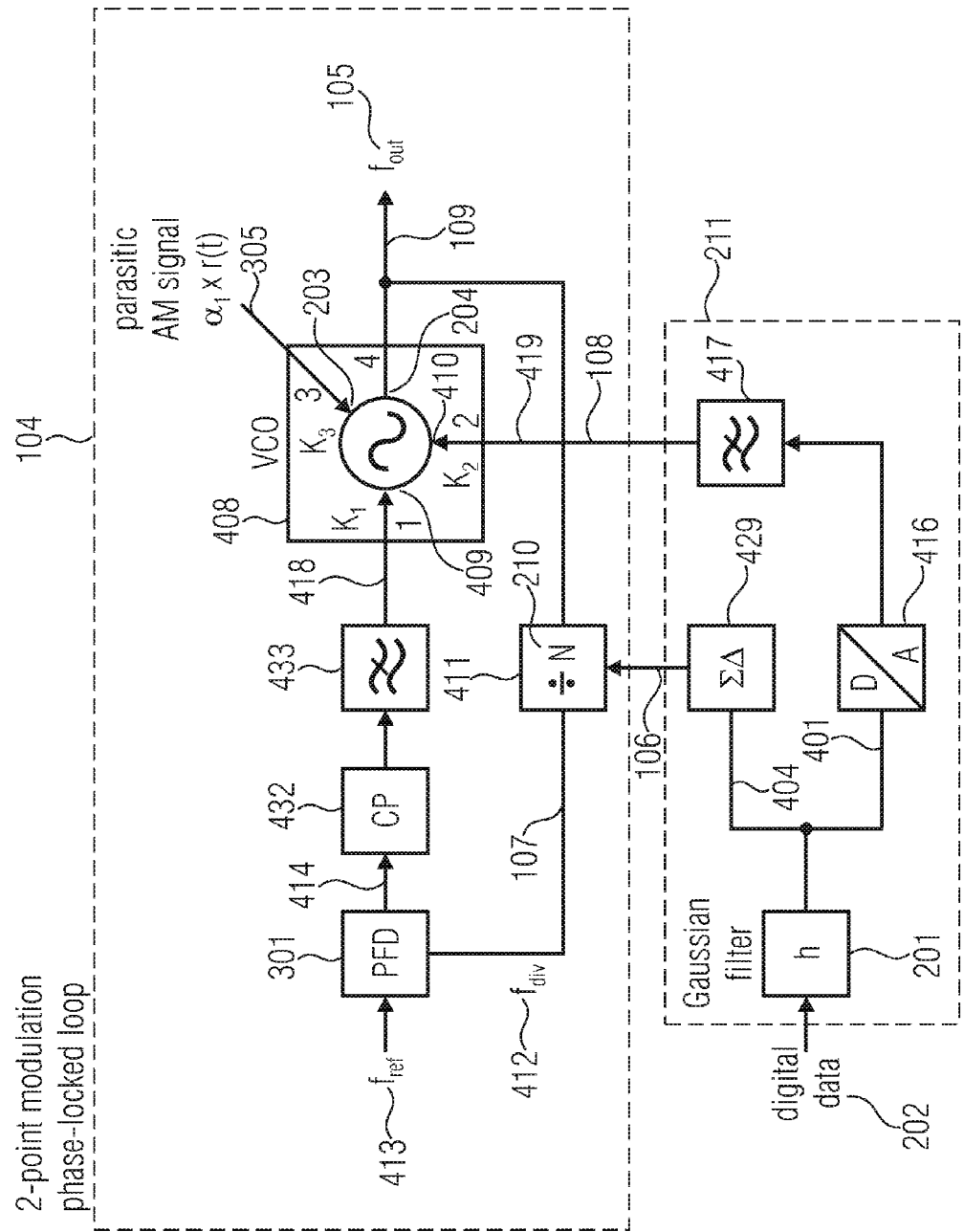
FIG. 2a shows a block diagram of a two-point polar modulation phase-locked loop according to an embodiment of the invention.

FIG. 2a shows a schematical block diagram of a two-point modulation phase-locked loop 104 according to an embodiment of the invention. The two-point modulation phase-locked loop 104 includes a voltage-controlled oscillator, or VCO 408, respectively, comprising a first input 409, a second input 410, a parasitic coupling path 203 and an output 204. The two-point modulation phase-locked loop 104 further includes a frequency divider 411 having a controllable division factor 210 lying within the feedback path 107 of the two-point modulation phase-locked loop 104. Further, the two-point modulation phase-locked loop 104 includes a phase frequency detector 301, a charge pump 432 and a smoothing filter 433. A phase-locked loop output signal 109, in this embodiment, is applied to the output 204 of the voltage-controlled oscillator 408 and comprises a frequency $f_{out}$. The phase-locked loop output signal 109 is looped into the feedback path 107 of the two-point modulation phase-locked loop 104 and experiences a modulation-dependent division of its frequency $f_{out}$ by the controllable division factor 210 in the frequency divider 411. The frequency $f_{out}$ is divided down to the modulated frequency $f_{div}$, which is, together with a reference frequency $f_{ref}$ applied at two inputs of the phase frequency detector 301. The phase frequency detector 301 generates a control signal 414 therefrom which is amplified via the (optional) charge pump 432 and is smoothed via the smoothing filter 433 and reaches the first input 409 of the voltage-controlled oscillator 408 as a first voltage signal 418. In this embodiment, a second voltage signal 419 is switched to the second input 410 of the voltage-controlled oscillator 408 and an unwanted parasitic AM signal $\alpha_1 \cdot r(t)$ 305 reaches the parasitic coupling path 203 of the voltage-controller oscillator 408. The voltage-controlled oscillator 408 generates the phase-locked loop output signal 109 comprising the frequency $f_{out}$ from the weighted voltage signals 418, 419, 305 taking the weighting factors $K_1$ for the first control input 409, $K_2$ for the second control input 410 and $K_3$ for the coupling path 203 into consideration.

The frequency divider 411 with the controllable division factor 210 is controlled by a first control value 106 in such a way that the first control value 106 causes a modulation of the polar-modulated signal 109 fed back via the feedback path 107 with the controllable division factor N 210, so that the divided frequency 412 is obtained from the frequency $f_{out}$ depending on the first control value 106. The first control value 106 is generated from digital data 202 passing a Gaussian filter 201 and generating a first control value signal 404 which is sigma-delta-converted via a sigma-delta converter 429 to represent the first control value 106. The second control value 108 is also generated from the digital data 202 by the same passing through the Gaussian filter 201 to form a second control value signal 401 which is digital-analog-converted and smoothed using a DA converter 416 and a smoothing filter 417 in order to generate the second control value 108. The generation of the first control value 106 and the second control value 108 is executed in a control value generator 211 including the Gaussian filter 201, the sigma-delta converter 429, the DA converter 416 and the smoothing filter 417.

The digital data 202 are simultaneously modulated onto the two-point modulation phase-locked loop 104 via two control values 106, 108. The first modulation point lies at the frequency divider 411 with a controllable division factor 210. The first modulation point represents a "slow modulation path", as a modulation in this point is only effective after passing through the feedback path 107 of the two-point phase-locked loop 104 including the phase frequency detector 301, the charge pump 432 and the smoothing filter 433.

The feedback path 107 shows low-pass performance, which is why the first control value signal 404 is first low-pass filtered before it reaches the first input 409 of the voltage-controlled oscillator 408 in order to cause an influence on the generated frequency $f_{out}$ there.

The second control value 108, however, causes a direct influence of the second control value signal 401 at a second modulation point "fast modulation path" of the two-point modulation phase-locked loop 104, lying at the second control input 410 of the voltage-controlled oscillator 408. The second control value 108 therefore does not need to pass the feedback path 107 of the two-point modulation phase-locked loop 104 but causes a direct setting of the generated frequency $f_{out}$ at the second control input 410 of the voltage-controlled oscillator 408. The frequency generation in the voltage-controlled oscillator 408 is influenced by a parasitic coupling path 203 to which, in this embodiment, an unwanted parasitic AM signal 305 is applied. This influence corresponds to an interference acting upon the two-point modulation phase-locked loop 104, and causing an unwanted interference spectrum overlaid onto the phase-locked loop output signal 109. An illustration of the frequency spectrum of the phase-locked loop output signal 109 follows in FIGS. 7a, 8a and 9a and is described in the associated description of the drawings.

Figure 2B:
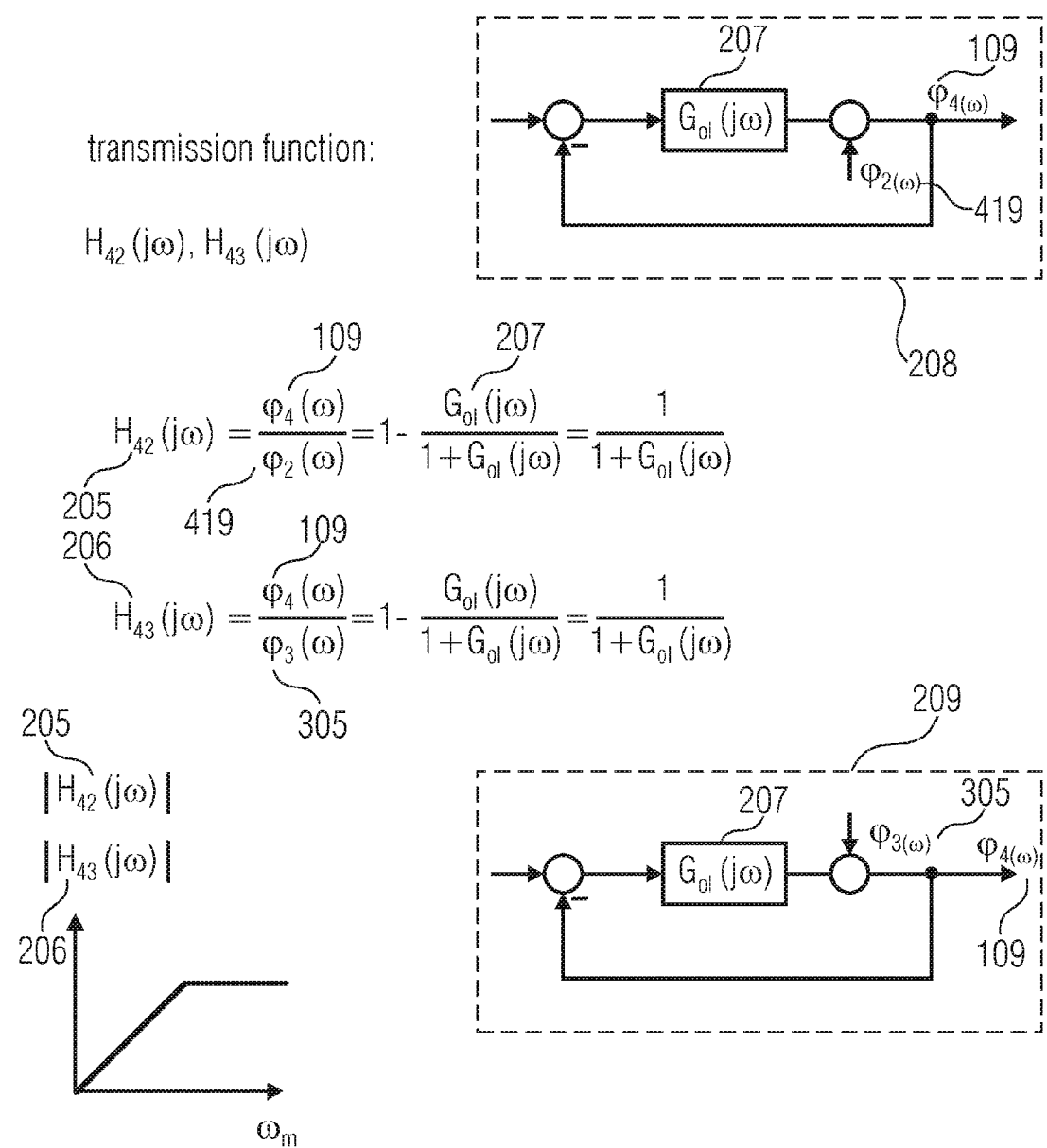
FIG. 2b shows a block diagram of an interference coupling path with an interference coupling transmission function and a block diagram of a compensation path with a compensation transmission function according to an embodiment of the invention.

FIG. 2b shows a block diagram of an interference coupling path with an interference coupling transmission function and a block diagram of a compensation path with a compensation transmission function, according to an embodiment of the invention. In FIG. 2b, the two transmission functions $H_{42}$ (jω) and $H_{43}$ (jω) are illustrated. The transmission function $H_{43}$ (jω) represents an interference coupling transmission function and describes the transmission of the interference coupling signal 305 or, respectively, the parasitic AM signal 305 from the parasitic coupling path 203 of the voltage-controlled oscillator 408 to the output 204 of the oscillator. The interference coupling signal 305 here corresponds to the signal $\phi_3$ (ω), and the phase-locked loop output signal 109 corresponds to the signal $\phi_4$ (ω). The voltage-controlled oscillator 408 comprises a second control input 410 to compensate the interference coupling signal 305 by means of a compensation signal $\phi_2$(ω). A compensation transmission function $H_{42}$ (jω) describes the transmission of the second voltage signal 419 or, respectively, the compensation signal $\phi_2$ (ω), applied at the second control input 410 of the voltage-controlled oscillator 408, to the phase-locked loop output signal $\phi_4$ (ω). In contrast to the control loop transmission function 207, comprising a low-pass performance, the interference coupling transmission function 206 and the compensation transmission function 205 show a high-pass performance. The absolute value frequency responses of both transmission functions are illustrated in FIG. 2b.

The control loop 208 for transmitting the second voltage signal $\phi_2$ (ω) to the phase-locked loop output signal $\phi_4$ (ω) is illustrated in FIG. 2b. With a control loop transmission function $G_{o1}$ (jω) a transmission from $\phi_2$ (ω) to $\phi_4$ (ω) results with the compensation transmission function $$H_{42}(j\omega) = \frac{1}{1 + G_{o1}(j\omega)}.$$

The transmission of the interference coupling signal φ3 (ω) to the phase-locked loop output signal φ4 (ω) 109 is executed by means of the interference control loop 209 comprising the same control loop transmission function 207 as the compensation control loop 208. The interference coupling transmission function $H_{43}$ (jω) corresponds to $$\frac{1}{1 + G_{o1}(j\omega)}.$$

Due to the same transmission function it is possible to compensate the effect of the interference coupling signal 305 or, respectively, a parasitic AM signal 305 by means of a second voltage signal 419 at the voltage-controlled oscillator 408.

Figure 3:
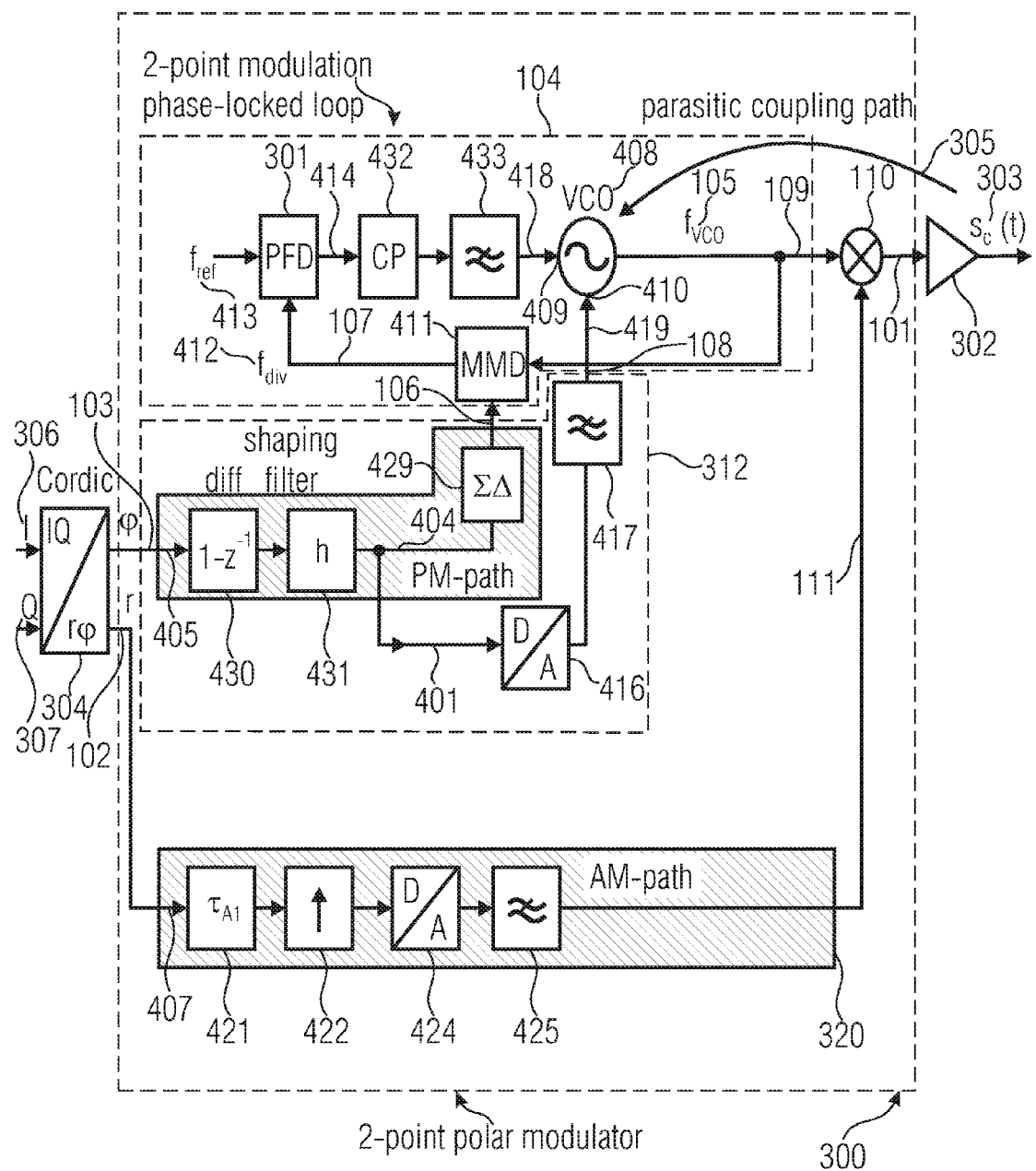
FIG. 3 shows a block diagram of a two-point polar modulator without a compensation path.

FIG. 3 shows a schematical block diagram of a two-point polar modulator without a compensation path. The two-point polar modulator 300 comprises a two-point modulation phase-locked loop 104, a control value generator 312, an AM path 320 and a modulation means 110. The two-point modulation phase-locked loop 104 corresponds to the two-point modulation phase-locked loop 104 according to FIG. 1 and according to FIG. 2a. The modulation means 110 corresponds to the modulation means 110 according to FIG. 1. The same combines a phase-locked loop output signal 109 to an amplitude signal 111 derived from the amplitude information 102 in order to generate the polar-modulated signal 101. In this embodiment, the polar-modulated signal 101 passes through a power output stage 302, which generates an output signal $s_c$ (t) 303 from the polar-modulated signal 101. The power output stage 302 is not part of the two-point polar modulator 300 in this embodiment, may, however, in other embodiments be part of the two-point polar modulator 300. From the polar-modulated signal 101 and the output signal 303, via a parasitic coupling path, an interference coupling signal 305 or, respectively, a parasitic AM signal 305 has an effect on the voltage-controlled oscillator 408. This causes, as described above, an unwanted change of the frequency $f_{VCO}$ generated by the oscillator 408, so that the polar-modulated signal 101 and also the output signal 303 comprise an unwanted interference spectrum.

The control value generator 312 in this embodiment corresponds to the control value generator 211 according to FIG. 2a, but comprises a differentiator 430 and a form filter 431 instead of the Gaussian filter 201. In FIG. 3, the digital data 202 according to FIG. 2a correspond to a signal 405 based on the phase information 103, which is differentiated via the differentiator 430 and is form-filtered via the form filter 431 in order to generate the first control value signal 404 or the second control value signal 401, respectively.

The two-point polar modulator 300 further comprises an AM path 320 including a first delay member 421, an oversampling means 422, a DA converter 424 and a smoothing filter 425. A signal 407 based on the amplitude information 102 is delayed using the first delay member 421, oversampled using the oversampling unit 422 and digital-analog converted using the DA converter 424, and smoothed using the smoothing filter 425 in order to generate the amplitude signal 111 derived from the amplitude information 102. The amplitude information r 102 and the phase information φ 103 are applied at both inputs of the two-point polar modulator 300. Amplitude information 102 and phase information 103 may, for example, be determined in an encoder 304, e.g. implementing a CORDIC algorithm, from two Cartesian components having an in-phase component I 306 and a quadrature component Q 307. In this embodiment, the encoder 304 is not part of the two-point polar modulator 300. In further embodiments, the encoder 304 may also be part of the two-point polar modulator 300, however.

The unwanted coupling of the output signal 303 into the VCO 408 causes a frequency modulation of the VCO 408 by the AM signal. This may be expressed mathematically as follows:

$$f_{VCO}(t) = f_{01} + K_3 \cdot \alpha_1 \cdot r(t-\tau), \quad (1)$$

wherein $K_3$ describes the VCO sensitivity factor in MHz/volts, $r(t-\tau)$ describes the AM signal component, and $\alpha_1$ describes the amplification factor which also takes the amplification of the coupling path into account. The time delay $\tau$ takes the delay of the coupling path into the VCO 480 into consideration. The VCO sensitivity factor $K_3$ depends on the coupling input of the radio frequency carrier signal or, respectively, the output signal 303. In case of a coupling onto the adjustment and/or setting input 409 of the oscillator 408, the sensitivity factor $K_3$ is identical, or virtually identical to the adjustment sensitivity factor $K_1$ of the VCO 408. The phase modulation component or, respectively, PM component causes a shift of the nominal oscillator frequency $f_0$ which is also taken into consideration by the new free-running oscillator frequency $f_{01}$. The oscillator output signal 109 is as follows:

$$s_{VCO}(t) = \cos(\omega t + \phi(t)) = \cos(2\pi f_{01} t + 2\pi K_3 \cdot \alpha_1 \cdot r(t-\tau) \cdot t) \quad (2)$$

The feedback mechanism of the phase-locked control loop 104 is able to compensate frequency components within the loop bandwidth. Modulation frequency components which are larger than the loop bandwidth may not be suppressed by the phase-locked loop (PLL) 104, however, as the loop is not able to follow fast frequency changes of the VCO 408. Thus, the transmission function characteristic of the AM signal shows a high-pass characteristic with regard to the output of the VCO 408. The high-pass characteristic of the two transmission functions $H_{42}(j\omega) = \phi_4(\omega)/\phi_2(\omega)$ and $H_{43}(j\omega) = \phi_4(\omega)/\phi_3(\omega)$ from the second control input 410 and the parasitic coupling path 203 to the output 204 of the VCO 408 was indicated qualitatively in FIG. 2b.

The two-point modulation phase-locked loop 104 is in particular used for systems in which the modulation bandwidth is substantially higher than the PLL or, respectively, the phase-locked loop bandwidth. The PM signal 405 is simultaneously switched to two points of the PLL or, respectively, the two-point modulation phase-locked loop 104. The first input modulates the division ratio 210 of the multi-modulus divider 411 or, respectively, the frequency divider 411 with the controllable division factor 210. The second input is set to the modulation input 410 of the VCO 408. The AM signal is combined within the mixing output stage or the modulation means, respectively, but may also be directly switched to the power amplifier 302, for example using a supply voltage modulation.

Some embodiments according to the invention are based on the concept of achieving a compensation of the parasitic AM/FM component 305 by adding the AM signal to the second control input 410 of the VCO 408 in order to thus modulate the VCO 408. As the second control input 410 comprises the same input/output high-pass characteristic as the parasitic AM/FM component, the AM/FM component may be perfectly or virtually perfectly cancelled out.

In the case of an optimum cancelling of the parasitic AM signal component $\alpha_1 t(t-\tau)$, the output frequency signal 109 of the VCO 408 is given by:

$$f_{vco}(t) = f_{01} + K_3 \cdot \alpha_1 r(t-\tau) - \tilde{K}_3 \tilde{\alpha}_1 \tilde{r}(t-\tau) \approx f_{01}. \quad (3)$$

$\tilde{K}_3$ and $\tilde{\alpha}_1 \tilde{r}(t-\tau)$ represent estimates of the VCO sensitivity factor $K_3$ or the AM signal component, respectively. Although the AM signal $r(t)$ is known exactly, the amplification $\alpha_1$ and the carrier phase delay $\phi = \omega_0 \tau$ may only be estimated, for example due to the unknown or not completely known radio frequency coupling path. In this respect, a settable amplification block $G = \hat{a}_1$ and a settable time delay are introduced into the AM compensation path. The time delay estimate $\hat{\tau}$ may be controlled very precisely, for example within a range of only a few nanoseconds, in order to be able to compensate the carrier phase delay $\phi = \omega_0 \tau$ of the parasitic radio frequency coupling.

Figure 4:
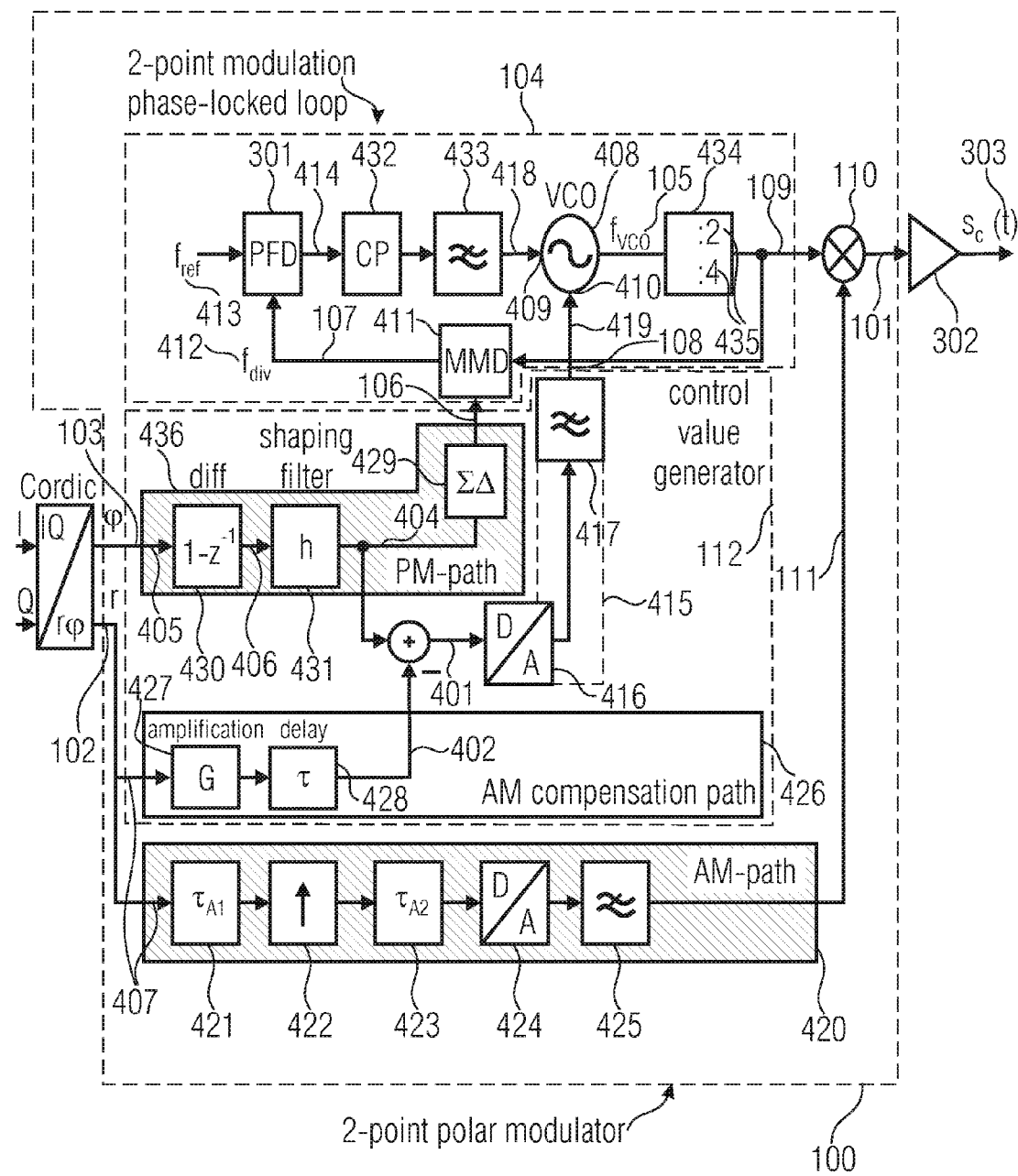
FIG. 4 shows a block diagram of a two-point polar modulator with a voltage-controlled oscillator according to an embodiment of the invention.

FIG. 4 shows a schematical block diagram of a two-point polar modulator with a voltage-controlled oscillator according to an embodiment of the invention. The two-point polar modular 100 includes a two-point modulation phase-locked loop 104, a control value generator 112, an AM path 420 and a modulation means 110. In contrast to the embodiment according to FIG. 3, the control value generator 112 additionally comprises an AM compensation path 426. The AM compensation path 426 generates a signal 402 derived from the amplitude information 102 by amplifying the signal 407 based on the amplitude information 102 by means of amplifying 427 and delaying the signal 407 based on the amplitude information 102 by means of a delay 428. The signal 402 derived from the amplitude information 102 is subtracted from a signal 403 derived from the phase information 103 in order to form the second control value signal 401. The second control value signal 401 reaches the second output of the control value generator 112 via a digital/analog converting means 415 in order to represent the second control value 108. The first control value 106 of the control value generator 112 corresponds to the illustration according to FIG. 3.

The signal 407 based on the amplitude information 102 may be a signal corresponding to the amplitude information 102 or a signal generated from the signal corresponding to the amplitude information 102 using a linear or non-linear function according to the embodiment of FIG. 1.

The AM path 420 of the two-point polar modulator 100 in addition to the AM path 320 according to FIG. 3 comprises another, second delay member 423 to delay the signal 407 based on the amplitude information 102 with a second delay. The signal 407 based on the amplitude information 102 passes through a first delay member 421, an oversampling unit 422, a second delay member 423, a DA converter 424 and a smoothing filter 425 to generate the amplitude signal 111 derived from the amplitude information 102 from the signal 407 based on the amplitude information 102.

The modulation means 110 corresponds to the modulation means 110 according to FIG. 3 and FIG. 1. The two-point modulation phase-locked loop 104 in addition to the two-point modulation phase-locked loop 104 according to FIG. 3 and FIG. 1 also comprises a frequency divider 434 with a fixed or settable division factor 435. The frequency divider 434 with a fixed or settable division factor 435 divides the frequency $f_{VCO}$ generated by the VCO 408 by a fixed or settable division factor 435 in order to thus generate a phase-locked loop output signal 109 with a frequency divided by the fixed division factor 435.

The subtraction of the signal 402 derived from the amplitude information 102 from the signal 403 derived from the phase information 103 causes the second control value signal 401 and thus the second control value 108 to also comprise a signal component which depends on the amplitude information 102. Thus, a signal component which depends on the amplitude information 102 reaches the second control input 410 of the voltage-controlled oscillator 408 and thus offers the possibility, depending on the amplification 427 and the delay 428 of the AM compensation path 426 to compensate an interference coupling signal 305 or a parasitic AM signal 305, respectively, acting on the VCO 408. The amplification 427 and the delay 428 may, for example, be settable to suppress an interference spectrum occurring in the output signal $s_c(t)$ 303 or in the polar-modulated signal 101 as far as possible based on the parasitic AM/FM coupling.

According to the embodiment, the two-point polar modulator 100 may, for example, be used in GSM 850/900 transmitters, wherein the (fixed or non-modulated) division factor 435 of the frequency divider 434 may be set to four. The two-point polar modulator 100 may also be used in GSM 1800/1900 transmitters if the (fixed or non-modulated) division factor 435 is, for example, set to two.

Figure 5:
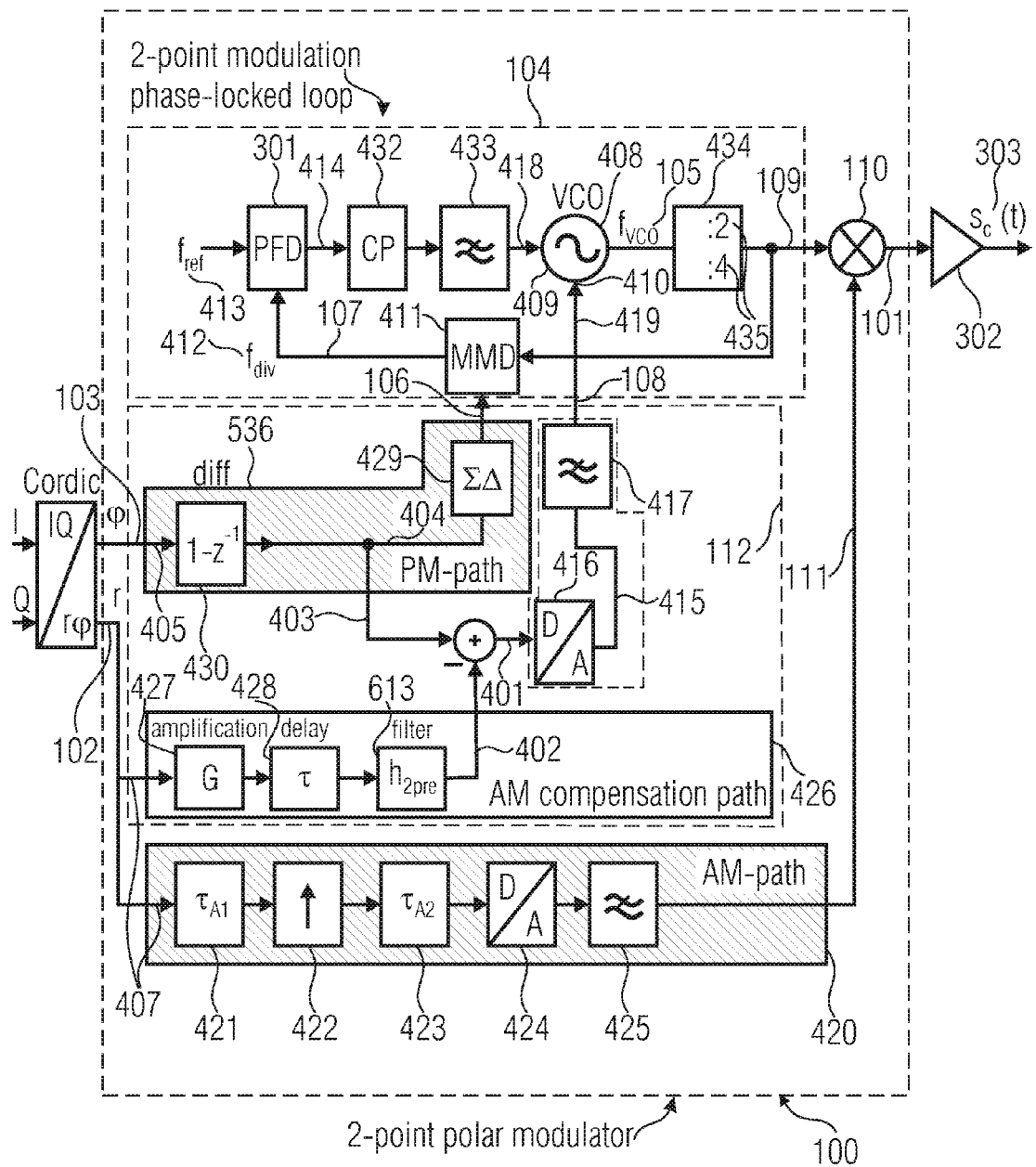
FIG. 5 shows a block diagram of a two-point polar modulator with a voltage-controlled oscillator according to a further embodiment of the invention.

FIG. 5 shows a schematical block diagram of a two-point polar modulator with a voltage-controlled oscillator according to a further embodiment of the invention. The two-point polar modulator 100 according to the further embodiment of the invention is different from the two-point polar modulator 100 according to the embodiment of FIG. 4 insofar that the AM compensation path 426 comprises a prefilter 613 in addition to the amplification 427 and the delay 428, in order to prefilter the signal 407 based on the amplitude information 102 in addition to an amplification using the amplification 427 and a delay using the delay 428, in order to generate the signal 402 derived from the amplitude information 102 from the signal 407 based on the amplitude information 102. The signal 402 derived from the amplitude information 102 is in this embodiment subtracted from the signal 403 derived from the phase information 103 in order to obtain the second control value signal 401. The second control value signal 401 is digital/analog converted and smoothed via the D/A conversion means 415 in order to represent the second control value 108. In this embodiment, the PM path 536 causing the transmission of the phase information 103 to the first control value 106 includes no form filter 431, as comprised by the embodiment according to FIG. 4. The signal 405 based on the phase information 103 is differentiated using the differentiator 430 in order to obtain a frequency signal corresponding to the first control value signal 404 and being sigma-delta-converted using the sigma-delta converter 429 to represent the first control value 106. The frequency signal or the first control value signal 404, respectively, in this embodiment also corresponds to the signal 403 derived from the phase information 103, from which the signal 402 derived from the amplitude information 102 is subtracted. The first control value 106 thus corresponds to a frequency, or describes a frequency change, using which the frequency divider 411 having the controllable division factor 410, or the multi-modulus divider 411, modulates the phase-locked loop output signal 109.

By the prefilter 613 in the AM compensation path 426, one degree of freedom more is obtained in order to optimally set or adjust the signal 407 based on the amplitude information 102 in order to compensate an interference coupling signal or a parasitic AM signal 305, respectively. Even if, by means of the second control value 108, a direct transmission of the amplitude information 102, or the signal 407 based on the amplitude information, respectively, to the voltage-controlled oscillator 408 takes place, this transmission path may comprise a slightly changed frequency characteristic compared to the interference coupling transmission path of the signal 407 based on the amplitude information 102 via the AM path 420, the modulation means 110, the power output stage 302 to the VCO 408. In order to enable adjusting the first transmission path, the prefilter 613 offers the possibility, for example via settable coefficients, to balance differences in the frequency response of both transmission paths.

A further embodiment comprises an AM compensation path 426 according to the illustration in FIG. 5 and a PM path 436 according to the illustration in FIG. 4. I.e., the further embodiment may comprise a prefilter 613 in the AM compensation path 426 and a form filter 431 in the PM path 436. It is further not necessarily required in the above mentioned embodiments for the second control value signal 401 to be generated by a subtraction of the signal 402 derived from the amplitude information 102 from the signal 402 derived from the phase information 103. For example, an addition of the mentioned signals may also be used, wherein then the amplification 427 or the filter coefficients of the prefilter 613 may, for example, be selected to be negative. As the components of the AM compensation path 426 may be selected or set such that the interference spectrum in the output signal 303 is suppressed as far as possible, the sign of the compensation transmission function may be selected or set, respectively.

Figure 6:
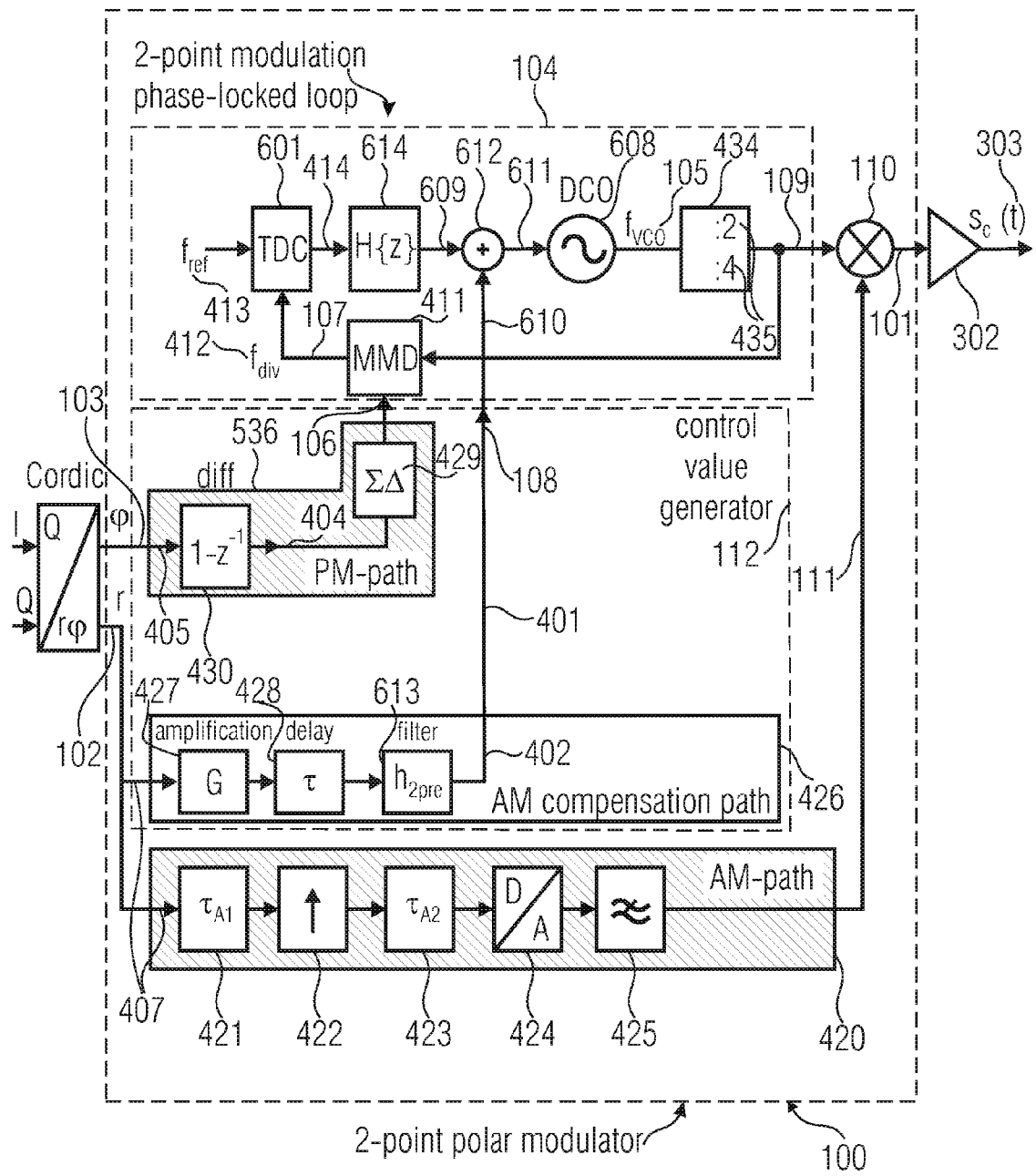
FIG. 6 shows a block diagram of a two-point polar modulator with a digitally controlled oscillator according to an embodiment of the invention.

FIG. 6 shows a block diagram of a two-point polar modulator having a digitally controlled oscillator according to an embodiment of the invention. The embodiment according to FIG. 6 is different from the embodiment according to FIG. 5 in the two-point phase-locked loop 104 and in the control value generator 112.

The two-point modulation phase-locked loop 104 comprises a digitally controlled oscillator (DCO) 608 instead of a voltage-controlled oscillator 408. The digitally controlled oscillator 608 comprises a control input to generate the frequency $f_{VCO}$ 105 depending on a control signal 611 applied to the control input. The control signal 611 may be a digital value sequence generating an output signal with the frequency $f_{VCO}$ depending on the respective digital input value. The digitally controlled oscillator 608 in this embodiment only comprises one input, via which two input signals 609, 610 are routed by means of the addition member 612. It is also possible that the addition member 612 is located in the digitally controlled oscillator 608, so that the digitally controlled oscillator 608 comprises two inputs to which the two input signals 609, 610 are applied.

The second input signal 610 corresponds to the signal 610 based on the second control value 108. The first input signal 609 corresponds to a signal derived from the control signal 414. In contrast to the two-point polar modulator 100 of the embodiment according to FIG. 5, the two-point polar modulator 100 in this embodiment does not comprise a charge pump 432 or a smoothing filter 433. The functionality of these two components may, for example, be replaced by a digital filter 614 having a transmission function H (z) to generate the signal 609 derived from the control signal 414 using the digital filter 614 from the control signal 414 which is also present in digital form. Instead of the phase frequency detector 301 according to the embodiments comprising a voltage-controlled oscillator 408, the two-point modulation phase-locked loop 104 having a digitally controlled oscillator 608 comprises a time/digital converter (TDC) 601 to compare the reference frequency 413 to the modulated frequency or divided frequency 412, respectively, and generate the control signal 414 based on the frequency difference, wherein the control signal represents a digital control signal. The digitally controlled oscillator 608 may, for example, comprise or control a bank of capacitors to generate the analog phase-locked loop output signal 109. In this embodiment, the frequency $f_{VCO}$ generated by the digitally controlled oscillator 608 is divided using the frequency divider 434 having a fixed, or non-modulated, division factor 435 by the fixed, or non-modulated, division factor 435, to generate the phase-locked loop output signal 109 comprising the frequency 105 divided by the fixed division factor 435. Alternative embodiments comprise a digitally controlled oscillator 608 directly generating the phase-locked loop output signal 109 without dividing the same by a fixed, or non-modulated, division factor 435 using the frequency divider 434.

The two-point modulation phase-locked loop 104 with the digitally controlled oscillator 608 comprises two control inputs, wherein the first control input sets the frequency divider 411 with a controllable division factor 410 by means of the first control value 106, and wherein the second control input sets the digitally controlled oscillator 608 directly via the addition member 612, for example by means of the second control value 108 bypassing the feedback path 107 of the two-point modulation phase-locked loop 104. In this embodiment, the first control value 106 and the second control value 108 comprise no coupling (at least no direct coupling). The control value generator 112 comprises a PM path 536 for generating the first control value 106 and an AM compensation path 426 independent of the PM path 536 for generating the second control value 108. The second control value signal 401 is generated from the signal 407 based on the amplitude information 102 using the amplification 427, the delay 428 and the prefilter 613 of the AM compensation path 426. The first control value signal 404 is generated from the signal 405 based on the phase information 103 using the differentiator 430 and represents the first control value 106, for example after a sigma-delta conversion using the sigma-delta converter 429. As, in this embodiment, the two-point modulation phase-locked loop 104 comprises a digitally controlled oscillator 608, a D/A converter 416 is no longer needed to cause the coupling of the signal 402 derived from the amplitude information 102 to the control input of the digitally controlled oscillator 608.

As a further variant it would be possible to combine the first control value signal 404 which is present in a digital form with the second control value signal 401, for example via an adder or subtractor, wherein the combined signal then corresponds to the second control value 108 without the same passing a D/A converter 416 with a smoothing filter 417.

Apart from that, a variant would be possible in which the AM compensation path 426 does not comprise a prefilter 613, but only an amplification 427 and a delay 428.

In a further variant, the PM path 536 may also comprise a form filter 431 according to the illustration in FIG. 4.

In some embodiments, the digitally controlled oscillator 608 is digitally modulated by means of the second control value 108 without the necessity of a digital/analog converter.

Figure 7A:
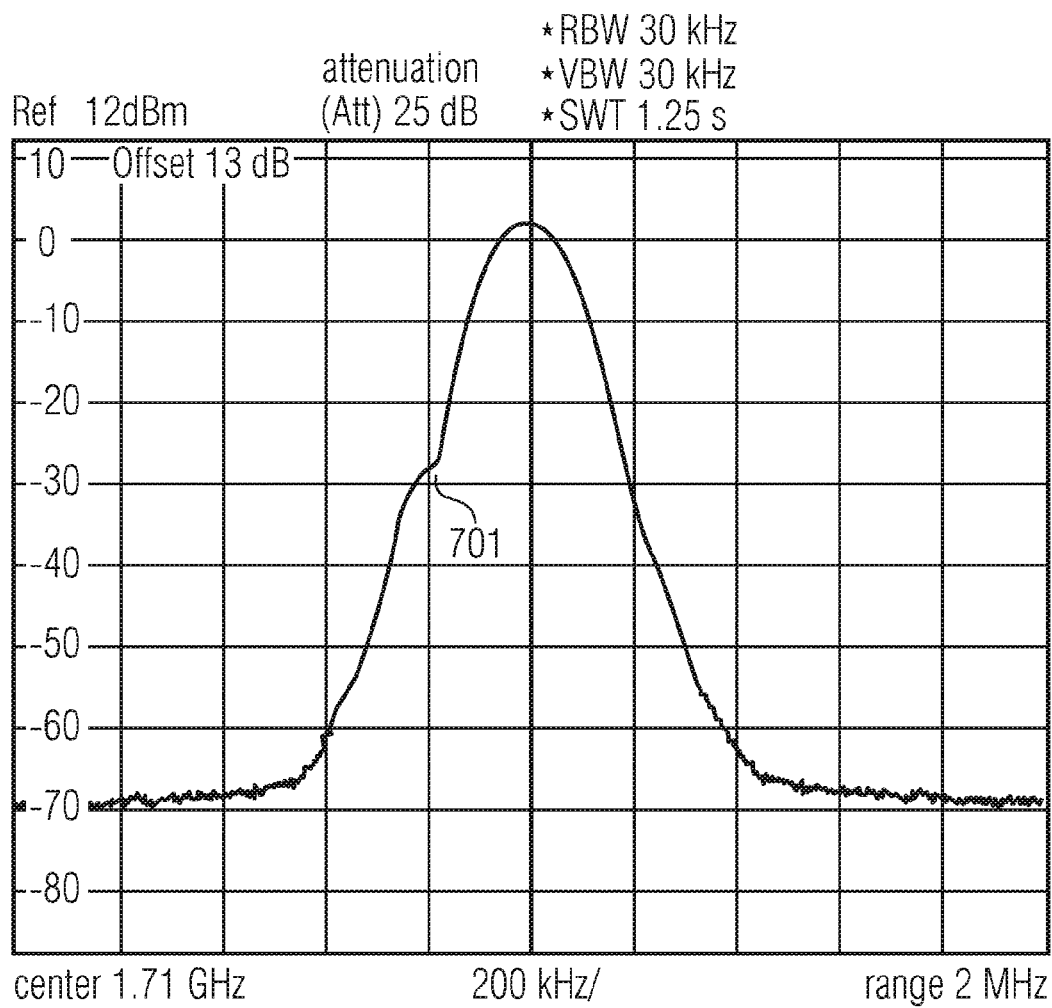
FIG. 7a shows a characteristic frequency spectrum of an EDGE-modulated output signal of a two-point polar modulator without a compensation path.

FIG. 7a shows a characteristic frequency spectrum of an EDGE-modulated output signal of a two-point polar modulator without a compensation path. Around a center frequency which is about 1.71 gigahertz, the frequency spectrum comprises an unsymmetrical left edge 701 which causes a violation of the GSM-EDGE spectral mask. The left edge 701 occurs due to an unwanted AM/FM coupling of the output signal 303 into the voltage-controlled, or digitally controlled, oscillator 408 or 608, respectively.

Figure 7B:
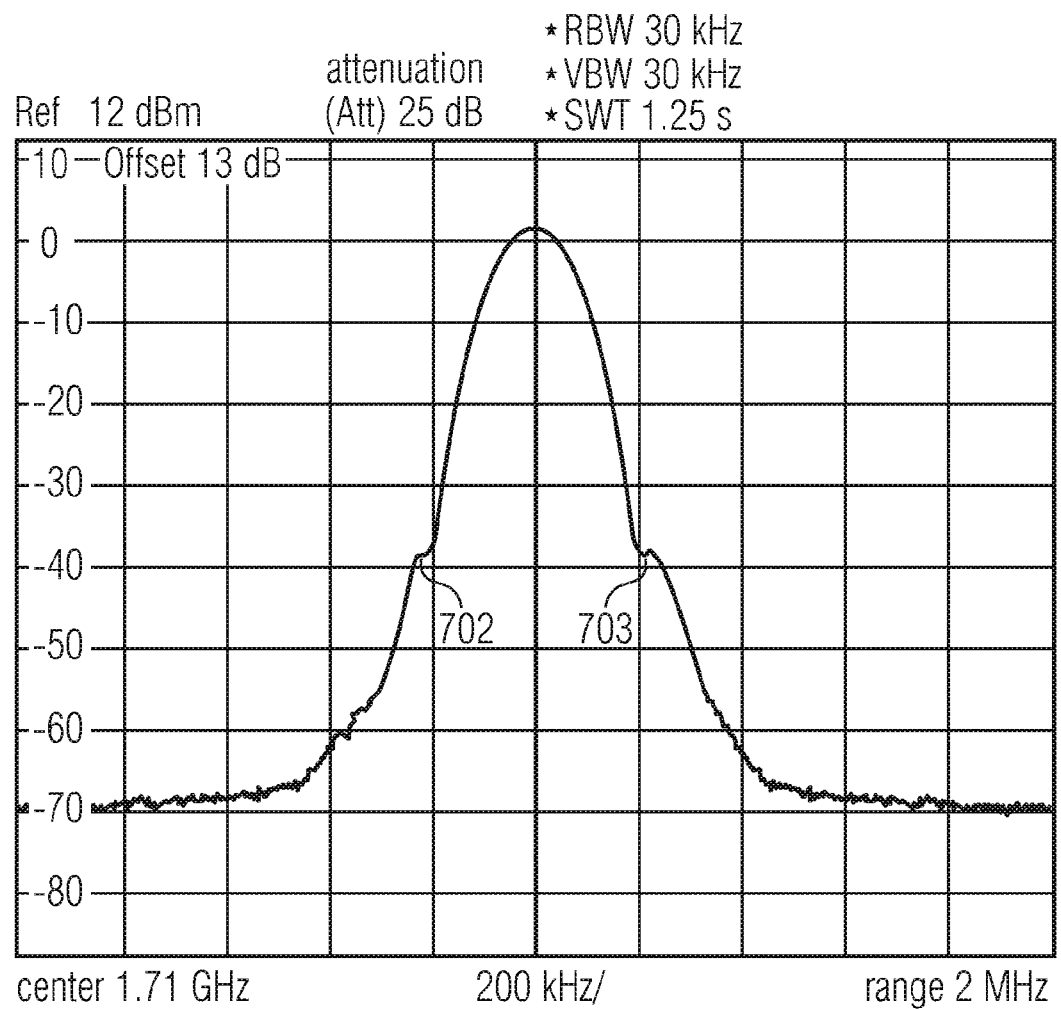
FIG. 7b shows a characteristic frequency spectrum of an EDGE-modulated output signal of a two-point polar modulator with a compensation path according to an embodiment of the invention.

FIG. 7b shows a characteristic frequency spectrum of an EDGE-modulated output signal of a two-point polar modulator having a compensation path according to an embodiment of the invention. The input signal, i.e. the amplitude information 102 and the phase information 103, is equal to the one used for generating the frequency spectrum according to FIG. 7a. The two-point polar modulator 100, however, by which the spectrum of FIG. 7b is generated, comprises an AM compensation path 426. Its components (amplification 427, delay 428 and prefilter 613) are set such that an interference spectrum in the output signal 303 illustrated in FIG. 7b is suppressed as far as possible. This may be seen from the fact that the frequency spectrum no longer comprises an unsymmetrical left edge 701, but two symmetrical edges 702, 703 which are additionally attenuated by approx. 10 dB compared to the unsymmetrical edge 701 according to FIG. 7a. The frequency spectrum thus enables keeping to the GSM-EDGE frequency mask.

Figure 8A:
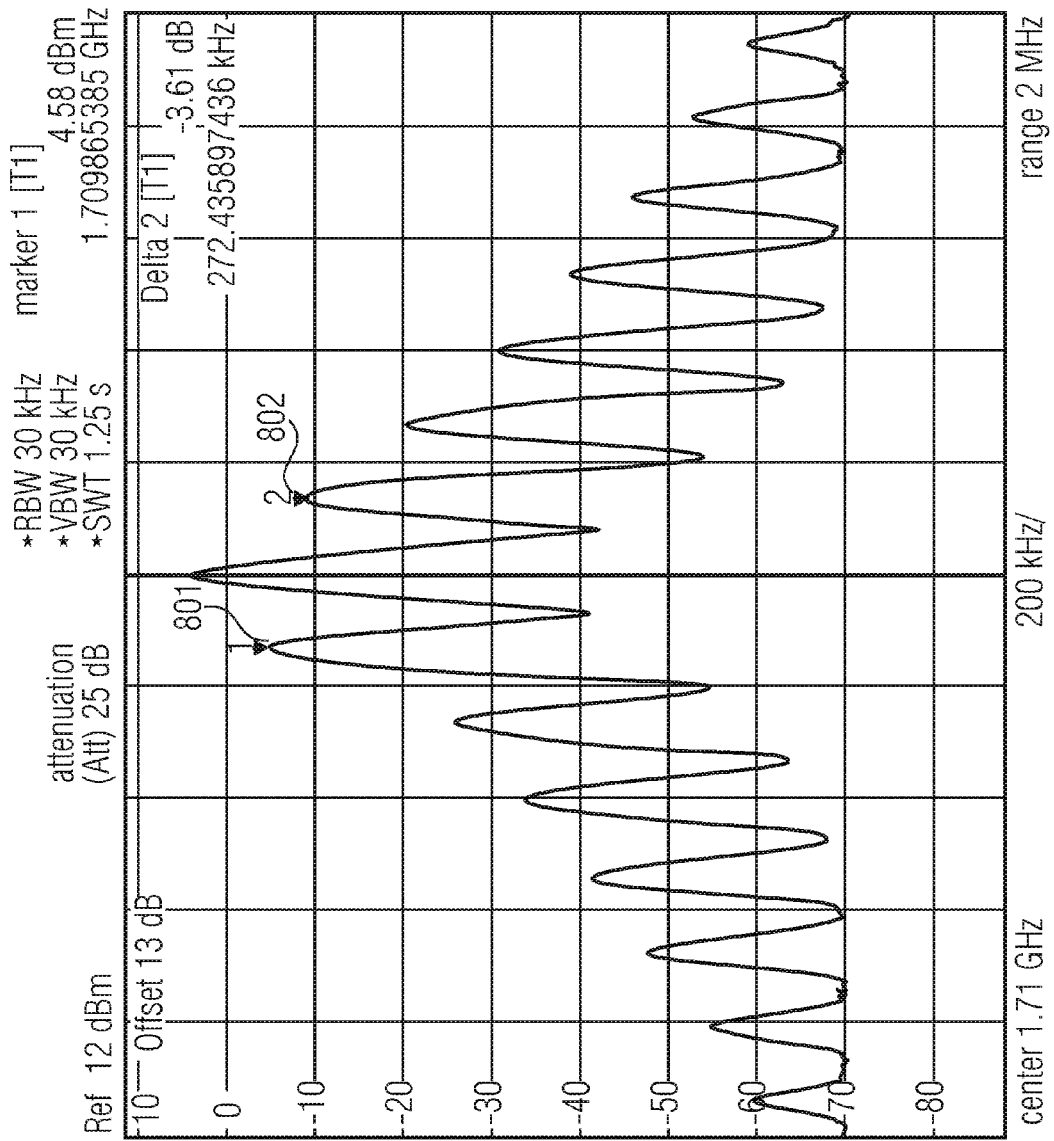
FIG. 8a shows a characteristic frequency spectrum of an amplitude-modulated pure carrier signal of a two-point polar modulator without a compensation path.

FIG. 8a shows a characteristic frequency spectrum of an amplitude-modulated pure carrier signal of a two-point polar modulator without a compensation path. To be able to execute a more accurate analysis of the effect of the AM/FM conversion, a pure cosine signal, or a signal with a continuous waveform which is amplitude modulated and comprises the signal course $r(t)=A\cos(\omega_m t)$ with $\omega_m=135$ kilohertz, is used. The phase-modulated signal component is set to zero. FIG. 8a shows a measured spectrum showing the AM signal without a PM signal component. The asymmetry in the spectrum is caused by the overlaying of the component converted from AM to FM and the desired AM signal component. ++On the lower side band 801 the AM-FM-converted component and the amplitude-modulated lower side band are added disadvantageously, or destructively, so that a cancellation of the side band energy result. On the upper side band 802 the AM-FM-converted component and the amplitude-modulated upper side band add up advantageously, or destructively, so that a summation of the signal energy results.

Figure 8B:
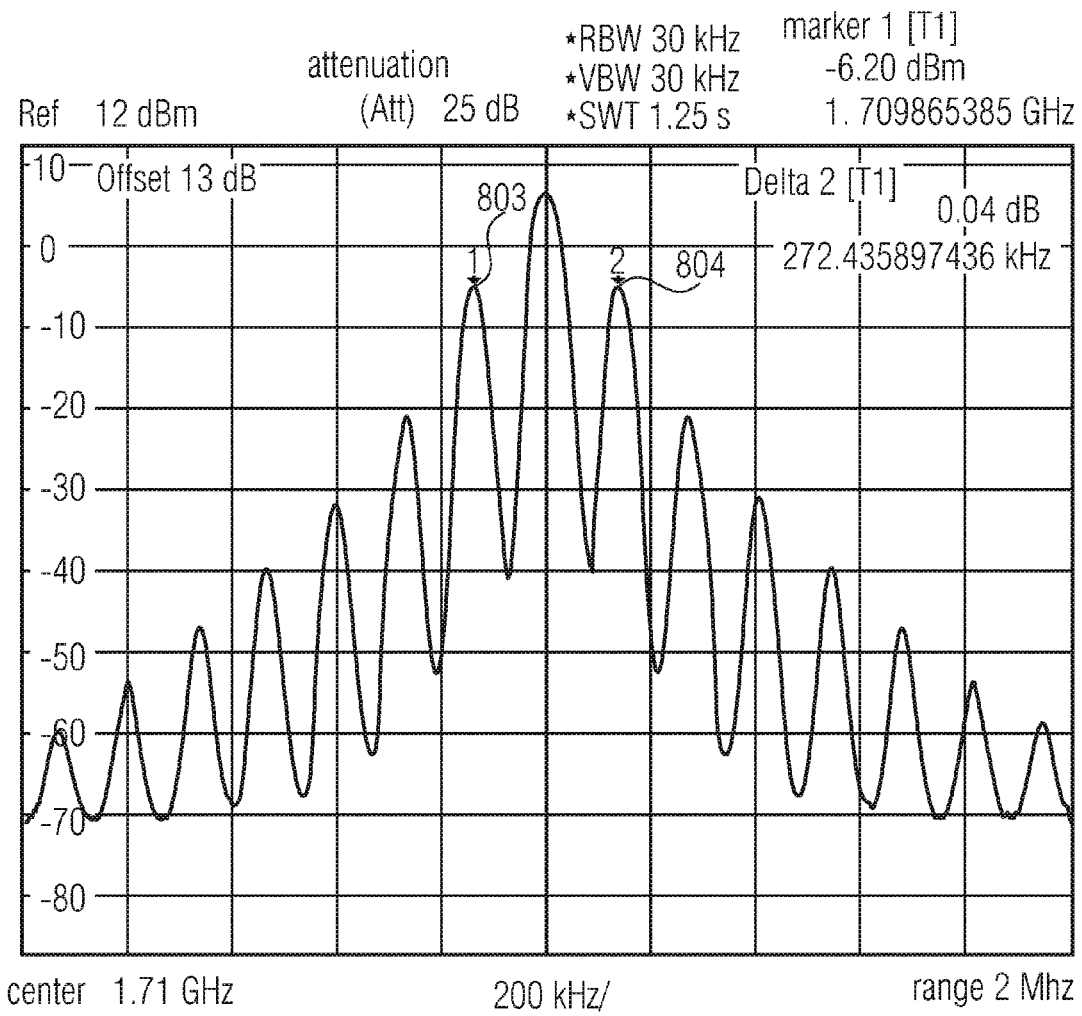
FIG. 8b shows a characteristic frequency spectrum of an amplitude-modulated pure carrier signal of a two-point polar modulator with a compensation path according to an embodiment of the invention.

FIG. 8b shows a characteristic frequency spectrum of an amplitude-modulated pure barrier signal of a two-point polar modulator with a compensation path according to an embodiment of the invention. The input signal, i.e. the amplitude-modulated pure carrier signal, corresponds to the input signal according to FIG. 8a. The two-point polar modulator with the compensation path causes a reduction of the disadvantageous interference signal energy of the parasitic coupling with a compensation path 426 which is accordingly set optimally. The lower side band 803 and the upper side band 804 approximately comprise the same signal power. It may clearly be seen that the AM-FM-converted components are effectively suppressed.

Figure 9A:
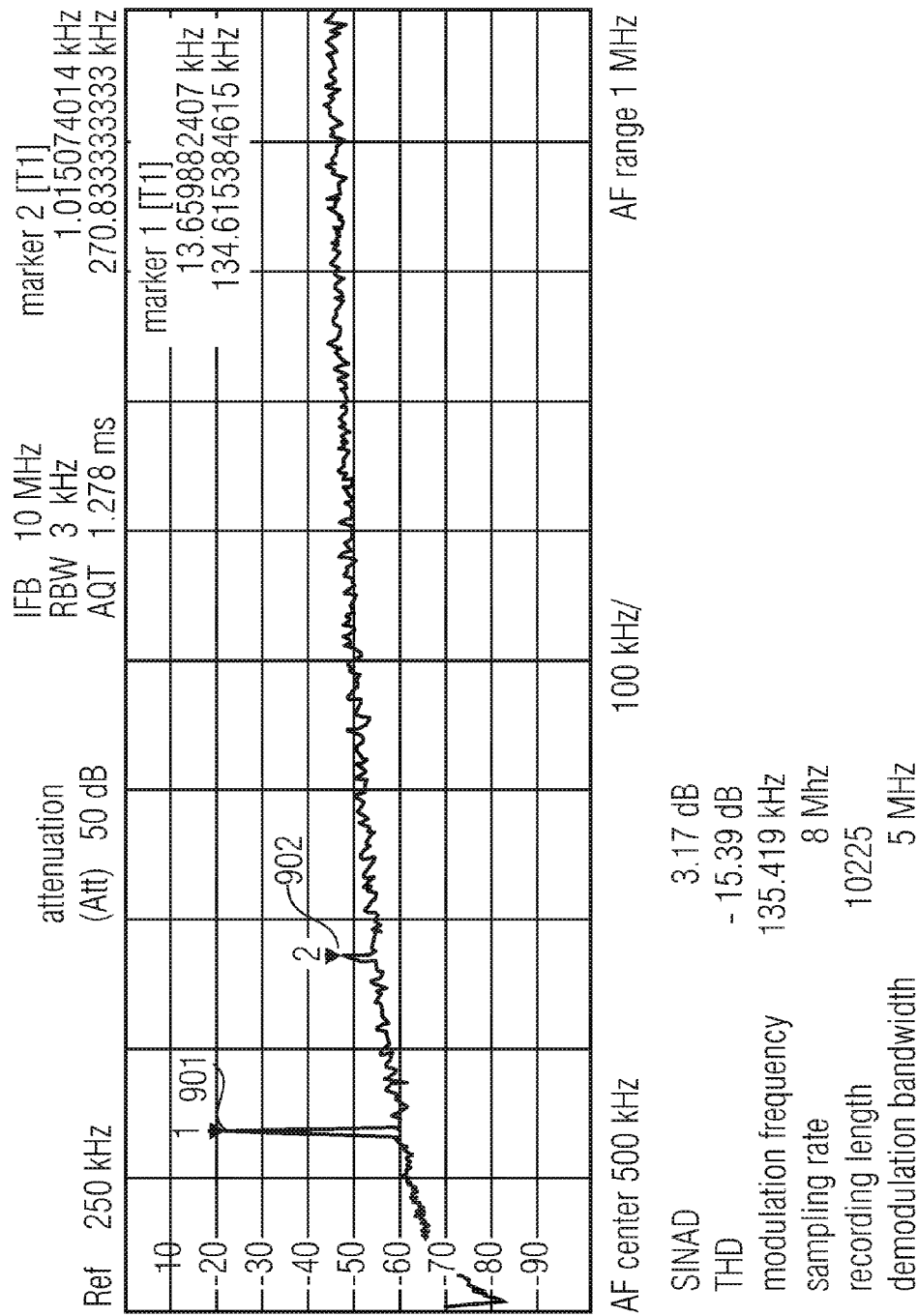

FIG. 9a shows a characteristic frequency spectrum of the frequency-demodulated pure carrier signal of FIG. 8a. In order to quantify the remaining FM component, the carrier signal may be frequency demodulated. FIG. 9a shows a spectrum of the frequency-demodulated carrier signal illustrated in FIG. 8a. It may clearly be seen from the frequency-demodulated spectrum that a significant spectral component is found in the AM modulation frequency $\omega_m=135$ kilohertz. In the illustration according to FIG. 9a, this spectral component is illustrated with the marker 1 at reference numeral 901. Further, a significant spectral component exists at double the AM modulation frequency of 270 kilohertz. The same is illustrated by the marker 2 at reference numeral 902. In embodiments of the invention, these spectral components of the parasitic AM/FM coupling are compensated. A corresponding illustration follows in FIG. 9b.

Figure 9B:
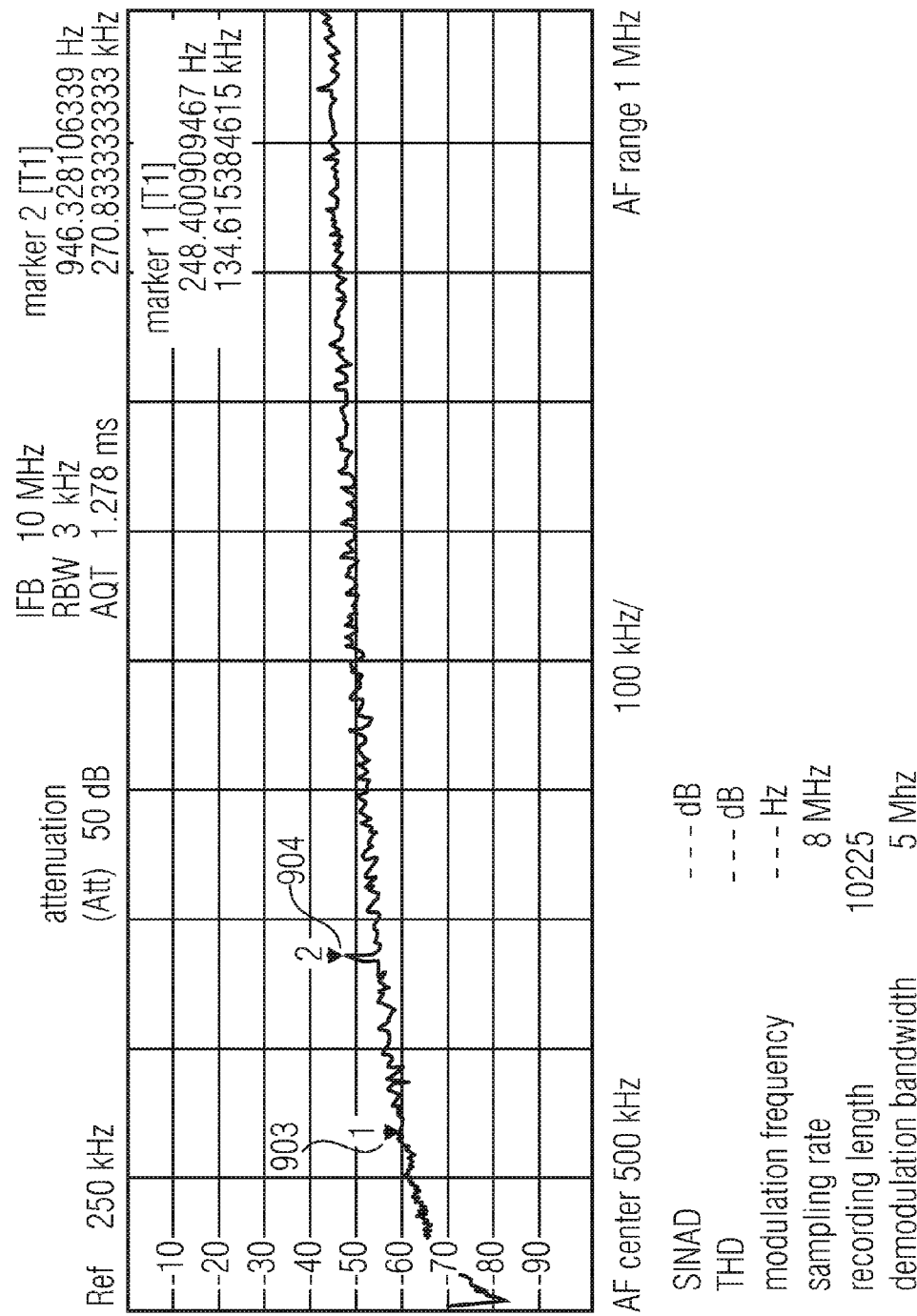
FIG. 9b shows a characteristic frequency spectrum of the frequency-modulated pure carrier signal of FIG. 8b.

FIG. 9b shows a characteristic frequency spectrum of the frequency-demodulated pure carrier signal of FIG. 8b. The first spectral component in the AM modulation frequency $\omega_m=135$ kilohertz is not detectable any more. The marker 1 at reference numeral 903 indicates this component. The second spectral component at double the amplitude modulation frequency of 270 kilohertz is hardly suppressed, however. The marker 2 at reference numeral 904 indicates the signal power value. If the AM compensation path 426 also comprises a prefilter 613 apart from amplification 427 and delay 428, with an optimum setting of the amplification 427, the delay 428 and the prefilter 613 also the second spectral component 904 may be suppressed completely or almost completely, respectively.

Figure 10:
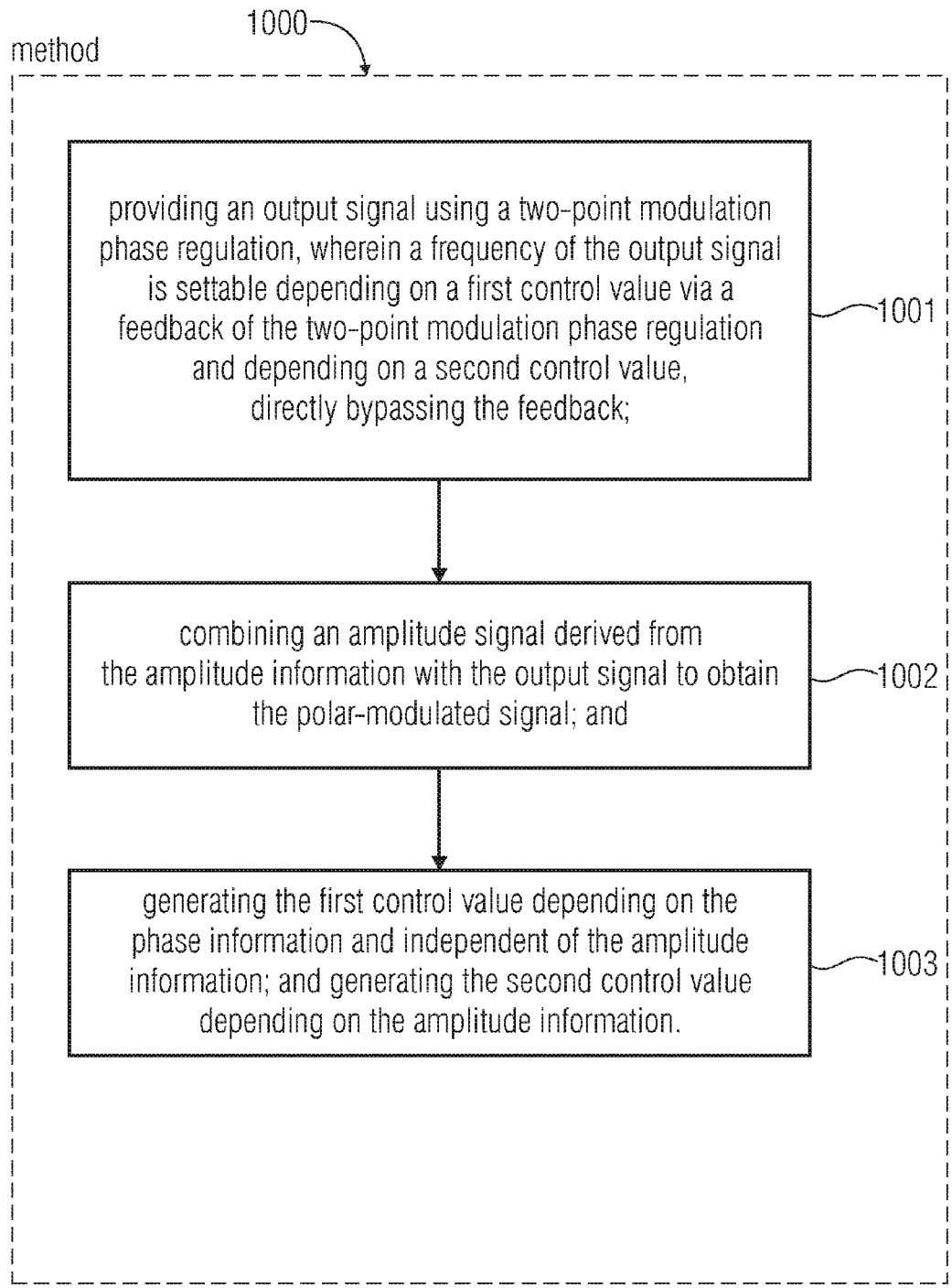
FIG. 10 shows a flowchart of a method for generating a polar-modulated signal.

FIG. 10 shows a flow chart regarding the method for generating a polar-modulated signal. The method 1000 includes a first step 1001, a second step 1002 and a third step 1003. The first step 1001 includes "providing an output signal using a two-point modulation phase regulation, wherein a frequency of the output signal is settable depending on a first control value via a feedback of the two-point modulation phase regulation, and depending on a second control value, directly, bypassing the feedback". The second step 1002 includes "combining an amplitude signal derived from the amplitude information with the output signal to obtain the polar-modulated signal". The third step 1003 includes "generating the first control value depending on the phase information and independent of the amplitude information; and generating the second control value depending on the amplitude information."

Figure 11:
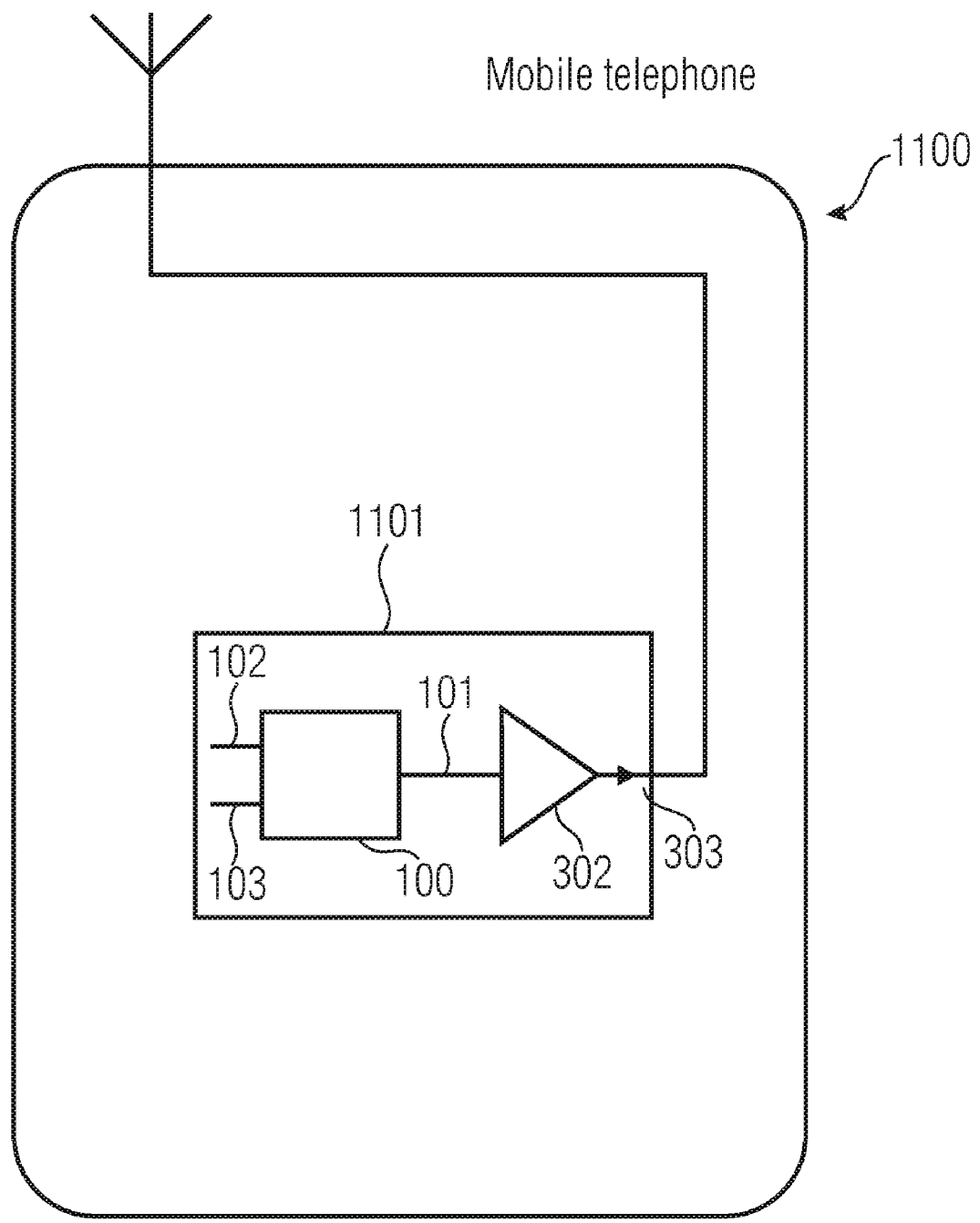
FIG. 11 shows a schematical illustration of a mobile telephone according to an embodiment of the invention.

FIG. 11 shows a schematical illustration of a mobile telephone according to an embodiment of the invention. A mobile telephone 1100 includes a two-point polar modulator 100 for generating a polar-modulated signal 101, a power amplifier 302 for amplifying the polar-modulated signal 101, and a printed circuit board 1101, wherein the two-point polar modulator 100 and the power amplifier 302 are arranged together on the printed circuit board 1101. The power amplifier 302 may generate a power output signal 303 based on the polar-modulated signal 101 which is, for example, coupled to an antenna of the mobile telephone 1100 in order to transmit the power output signal 303 to the dialog partner.

The polar modulator 100 may be implemented according to one of the embodiments in FIGS. 1, 3, 4, 5, 6, so that the polar modulator 100 generates a polar-modulated signal 101 from phase information 103 and amplitude information 102. The two-point polar modulator 100 is implemented to counteract an interference of the power output signal 303 with regard to the two-point polar modulator 100 using a two-point modulation phase regulation.

Based on this interference compensation of the two-point polar modulator 100, the mobile telephone 1100 does not need to comprise separate shielding chambers for the two-point polar modulator 100 and the power amplifier 302. A feedback of the power output signal 303 to the two-point polar modulator 100 which may, for example, be reduced by implementing separate shielding chambers for the two-point polar modulator 100 and the power amplifier 302, may be compensated by a two-point modulation phase regulation in the two-point polar modulator 100 in the mobile telephone 1100 according to this embodiment of the invention. Due to this feature of the two-point modulator 100 no separate shielding chambers are required on the printed circuit board 1101. The mobile telephone 1100 may be manufactured at lower costs and in a lighter form, i.e. the weight of the mobile telephone may be reduced substantially.

Depending on the circumstances, the inventive method 1000 may be implemented in hardware or in software. The implementation may be on a digital storage medium, in particular a floppy disc or a CD having electronically readable control signals which may cooperate with a programmable computer system so that the corresponding method is executed. In general, the invention thus also consists in a computer program product having a program code stored on a machine-readable carrier for executing the inventive method, when the computer program product is executed on a computer. In other words, the invention may thus be realized as a computer program having a program code for executing the method, when the computer program is executed on a computer.

In some embodiments of the present invention, a costly and time-consuming decoupling or shielding of the output signal of the power stage from the VCO may thus be omitted. This means that manufacturing costs may be omitted and the mobile telephone may be manufactured at substantially lower costs. For example, separate mobile radio shielding chambers no longer need to be accommodated on the PCB (printed circuit board) of the mobile radio telephone.

Embodiments according to the invention may, for example, be used in mobile radio telephones of the next generation which operate by means of EDGE modulation methods and may thus achieve substantially higher data rates than modulation methods operating according to the prior GSM standard.

Embodiments according to the invention comprise output signals of the power output stage, whose spectral mask corresponds to the requirements of the EDGE standard, i.e. whose power spectrum is located within the predetermined tolerance range. The power spectrum of the output signal of the power output stage is at least approximately symmetrical and shows interference signal couplings only at a substantially lower signal power than is the case with conventional polar modulator output signal spectrums with signals modulated with EDGE.

Due to the improved signal power and interference power gaps in embodiments according to the invention, the mobile telephone may, for example, transmit with a lower signal power, so that the accumulator lasts longer, i.e. the conversation times may be approximated to the standby times. There is further the possibility that, with embodiments according to the invention, more mobile telephones may be located within a cell or that the cell size may be increased, i.e. less base stations are required for receiving the mobile telephone signal. All the above-final mentioned characteristics lead to a cost reduction. I.e., accumulator costs of the mobile telephone are reduced, hardware costs of the mobile telephone for previously needed shielding measures are reduced and costs for setting up indispensable base stations are reduced.

In the following, further embodiments are described and further features are explained.

Embodiments according to the invention relate to the compensation of an unwanted amplitude frequency conversion in a polar transmitter architecture which uses a two-point modulation phase-locked loop. Embodiments according to the invention may be employed in the cellular telephone market or, respectively, in the mobile radio telephone market, in particular for the design of power-efficient RF transmission architectures (RF=radio frequency). The design of such power-efficient transmitters has become an important criterion for portable devices, or portable devices which may be hand-held. Embodiments according to the invention may be employed in digital cellular telephone systems, for example in mobile radio telephones which operate according to the GSM standard or the GSM-EDGE standard, respectively. Embodiments according to the invention may also be employed where modulation types are used which operate with non-constant envelopes in order to achieve higher data rates. Embodiments according to the invention enable similar conversation and standby times for the GSM standard of the next generation. Embodiments according to the invention may also be used where the signal path may, for example, be not completely linear. In embodiments according to the invention, for example no separation of the transmission path from the amplifier path of the power amplifier needs to be requested on the printed circuit board (PCB) of the mobile radio telephone. In embodiments according to the invention, a parasitic coupling of the output signal into the VCO may be suppressed or prevented, respectively, without requiring a separation of the transmitter from the power amplifier.

Embodiments according to the invention operate with a polar modulator concept. The polar modulator concept separates the modulation signal into an amplitude modulation (AM) signal and a phase modulation (PM) signal. In embodiments according to the invention, operation may be executed by means of Cartesian coordinates, i.e. a real portion and a quadrature portion, and also polar coordinates, i.e. a phase portion and an amplitude portion. In embodiments according to the invention, both coordinate systems may be transformed into each other. The PM signal is directly fed into the phase-locked loop (PLL) whose output here represents the phase-modulated carrier signal. The AM signal may be combined in an output stage.

There are different methods of combining the PM signal and the AM signal. For example, the output stage may comprise a linear mixer. The AM signal may alternatively also be upmodulated onto the voltage supply of the output driver stage. The output stage may execute a pulse-width modulation in order, for example, to generate different amplitude values of the fundamental oscillation depending on the pulse width. There are thus different methods for combining the PM information and the AM information. A further method is, for example, a supply voltage modulation of the output driver stage or also directly of the power amplifier stage. These methods achieve a very high power efficiency.

Embodiments according to the invention show a special robustness with regard to parasitic couplings of the power amplifier output signal into the VCO and thus, for example, need no shielding chambers between the power amplifier (PA) and the transmitter on the "PCB", or on the printed circuit board of the mobile radio telephone. Embodiments according to the invention suppress the coupling of the output signal into the VCO and thus the generation of an unwanted AM/FM conversion signal and thus counteract a significant deterioration of the modulation spectrum, or an increase of the error vector quantity, respectively.

Embodiments according to the invention include a polar modulator transmitter architecture having a two-point modulation phase-locked loop with a fractional division factor N.

In some embodiments according to the invention, the asymmetric frequency spectrum of a polar modulator which comprises no AM compensation path may be transformed into a symmetrical frequency spectrum which keeps to the GSM-EDGE spectral modulation mask. The overlay in the spectrum of the AM/FM-converted component with the desired AM signal component may be influenced in embodiments according to the invention in such a way that the frequency spectrum of the output signal resulting from the overlay only comprises the desired AM signal component and suppresses the AM/FM-converted component in the frequency spectrum of the output signal. Embodiments according to the invention provide a possibility to compensate this parasitic AM/FM component. The effort for a most demanding shielding and decoupling of the output signal from the VCO may be saved in embodiments according to the invention. Further, no separate RF shielding chambers need to be used on the printed circuit board (PCB) of the mobile radio telephone.

Embodiments according to the invention describe a method of compensating parasitic AM/FM conversions based on parasitic coupling of the carrier signal into the VCO. The coupling of the carrier signal into the VCO causes a frequency modulation of the VCO by the AM signal. This may be expressed mathematically by the following equation:

$$f_{VCO}(t) = f_{01} + K_3 \cdot \alpha_1 \cdot r(t-\tau),$$

wherein $K_3$ describes the VCO sensitivity factor in MHz/V, $r(t-\tau)$ describes the AM signal component and $\alpha_1$ the amplification factor which takes the amplification of the coupling path into consideration. The time delay value $\tau$ takes the delay of the coupling path into the VCO into consideration. The VCO sensitivity factor $K_3$ depends on the coupling input of the RF carrier signal. For the case of coupling onto the setting or adjustment input, the sensitivity factor is identical to the adjustment sensitivity factor $K_1$ of the VCO. The PM component causes a shift of the nominal oscillator frequency $f_0$ which is considered by the new free running oscillator frequency $f_{01}$. The oscillator output signal may be rewritten into:

$$s_{VCO}(t) = \cos(\omega t + \phi(t)) = \cos(2\pi f_{01} t + 2\pi K_3 \cdot \alpha_1 \cdot r(t-\tau) \cdot t).$$

The feedback mechanism of the phase-locked loop, or PLL, is able to compensate frequency components within the loop bandwidth. Frequency components which are higher than the loop bandwidth may, however, not be suppressed by the PLL, as the loop is not able to follow fast frequency changes of the VCO. This is why the transmission function characteristic of the AM signal shows a high-pass characteristic with regard to the output. The high-pass characteristic of the two transmission functions $H_{42}(j\omega) = \omega_4(\omega)/\phi_2(\omega)$ and $H_{43}(j\omega) = \phi_4(\omega)/\omega_3(\omega)$ of the "inputs" 2 and 3 of the VCO to the output 4 of the VCO is qualitatively indicated in FIG. 2b. The "input 3" of the VCO here describes a path for a parasitic coupling.

FIG. 2a shows a two-point modulation phased-locked loop with a fractional division factor N. This two-point modulation phased-locked loop is in particular used in systems in which the modulation bandwidth is much higher than the phase-locked loop bandwidth. The PM signal is simultaneously coupled in at two points of the phase-locked loop. The first input modulates the division ratio of a multi-modulus divider (or multi-division factor divider) and the second input is put onto the modulation input of the VCO. The AM signal is combined in the mixer output stage, but may also be directly put onto the power amplifier, for example using a supply voltage modulation. The basic idea of some embodiments according to the invention consists in the compensation of the parasitic AM/FM component by adding the AM signal onto the second input of the VCO, wherein the AM signal modulates the VCO. As this input comprises the same input/output high pass characteristic as the parasitic AM/FM component, the AM/FM component may be cancelled out or deleted perfectly or virtually perfectly. In the case of an optimum cancellation of the parasitic AM signal component portion $\alpha_1 r(t-\tau)$, the output frequency of the VCO output signal is given by:

$$f_{vco}(t) = f_{01} + K_3 \cdot \alpha_1 r(t-\tau) - \tilde{K}_3 \tilde{\alpha}_1 \tilde{r}(t-\tau) \approx f_{01}.$$

$\tilde{K}_3$ and $\tilde{\alpha}_1 \tilde{r}(t-\tau)$ represent estimates of the VCO sensitivity factor $K_3$ or the AM signal component, respectively. Although the AM signal $r(t)$ is known exactly, the amplification $\alpha_1$ and the carrier phase delay $\phi = \omega_0 \tau$ may only be estimated due to the unknown RF coupling path. In this respect, for example, an adjustable amplification block $G = \hat{a}_1$ and an adjustable time delay are introduced into the AM compensation path. The time delay estimate $\tilde{\tau}$ may be controlled very precisely, within a range of only a few nanoseconds, in order to be able to compensate the carrier phase delay $\phi = \omega_0 \tau$ of the parasitic RF coupling path.

One central aspect of some embodiments according to the invention is a method for compensating parasitic AM/FM conversions in polar modulator transmitter architectures in connection with a two-point modulation phase-locked loop with a fractional division ratio N, wherein the PLL, or the two-point modulation phase-locked loop, is used for a phase modulation.

Embodiments according to the invention may also include digital phase-locked loops (DPLL) with digitally controlled oscillators (DCO). In such embodiments, the oscillator may, for example, be set by a digital input which controls a bank of capacitors. The DCO may be digitally modulated without requiring a digital/analog converter.

Embodiments according to the invention may be used for the GSM-EDGE standard. For example, the VCO may operate with frequencies in a range of 3.8 gigahertz. In the case of GSM 850/900, the divider at the output of the VCO may comprise a division factor of 4, whereas with GSM 1800/1900 the divider may comprise a division ratio of 2. The AM compensation path may comprise a programmable amplification and a delay block. It may additionally or alternatively comprise a prefilter of a pre-distortion filter. The amplification block may, for example, be realized by a multiplier or, alternatively, by a shift addition operation. The digital time delay may, for example, be settable in a range of a few nanoseconds to be able to compensate the carrier phase delay. For example, in this respect all-pass filters or polyphase filter design methods may be used, for example guaranteeing time delays in a range of fractions of the sampling rate.

FIG. 7b shows an EDGE-modulated spectrum with a perfect compensation of the parasitic AM/FM portion. The spectrum shows a symmetrical characteristic and fulfils the GSM modulation mask requirements of the frequency range. This means that the spectrum according to FIG. 7a lies within the predetermined tolerance range required by the GSM standard.

FIG. 8b shows a spectrum of a pure AM carrier signal with an AM/FM compensation and FIG. 9b shows the associated FM demodulated carrier signal. It may be clearly seen that the AM/FM-converted components are cancelled out or deleted effectively.

In the case of a digital PLL, the blocks for forming the compensation path may be realized completely by digital logic circuits.

Embodiments according to the invention may, for example, be applied in GSM, UMTS, Bluetooth and in transmission concepts for mobile communication.

The AM compensation path may be introduced into the summation point before the DCO both with a positive and also negative sign according to FIG. 6. A compensation with a positive sign at the summation point may also be achieved by a negative amplification in the AM compensation path.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A two-point polar modulator for generating a polar-modulated signal based on an amplitude information and a phase information, comprising:
   a two-point modulation phase-locked loop which is implemented to enable a frequency setting depending on a first control value via a feedback path of the two-point modulation phase-locked loop, and to enable a frequency setting depending on a second control value, directly, bypassing the feedback path, wherein the two-point modulation phase-locked loop is implemented to provide a phase-locked loop output signal depending on the two control values;
   a modulation means which is implemented to combine an amplitude signal derived from the amplitude information with the phase-locked loop output signal in order to generate the polar-modulated signal; and
   a control value generator which is implemented to generate the first control value depending on the phase information and independent of the amplitude information, and which is implemented to generate the second control value depending on the amplitude information.

2. The two-point polar modulator according to claim 1, wherein the control value generator is implemented to generate the second control value so that the second control value counteracts an interference effect on the two-point modulation phase-locked loop.

3. The two-point polar modulator according to claim 2, wherein the interference effect on the two-point modulation phase-locked loop corresponds to a parasitic AM/FM coupling of the polar-modulated signal or a signal derived from the polar-modulated signal or a signal generated by the modulation means.

4. The two-point polar modulator according to claim 1, wherein the control value generator is implemented to generate the second control value depending on the amplitude information and the phase information.

5. The two-point polar modulator according to claim 1, wherein the control value generator is implemented to generate a first control value signal representing the first control value from a signal based on the phase information or a signal derived from the phase information.

6. The two-point polar modulator according to claim 1, wherein the control value generator is implemented to generate a second control value signal representing the second control value from a signal based on the amplitude information or a signal derived from the amplitude information;
   wherein the signal based on the amplitude information is a signal generated from a signal corresponding to the amplitude information using a linear or a non-linear function;
   wherein the linear function corresponds to an amplification;
   wherein the non-linear function corresponds to a Taylor series or a power series.

7. The two-point polar modulator according to claim 1, wherein the control value generator is implemented to combine a signal based on the amplitude information or a signal derived from the amplitude information with a signal based on the phase information or a signal derived from the phase information to generate a second control value signal representing the second control value.

8. The two-point polar modulator according to claim 1, wherein the control value generator is implemented to overlay a signal based on the amplitude information or a signal derived from the amplitude information with a signal based on the phase information or with a signal derived from the phase information in an additive or subtractive way in order to generate a second control value signal representing the second control value.

9. The two-point polar modulator according to claim 1, wherein the control value generator comprises a differentiator which is implemented to differentiate a phase signal based on the phase information in order to generate a frequency signal, wherein the frequency signal or a signal derived from the frequency signal corresponds to the first control value signal.

10. The two-point polar modulator according to claim 1, wherein the two-point modulation phase-locked loop further comprises a controllable frequency divider which is implemented to modulate an output frequency of the two-point modulation phase-locked loop depending on the first control value;
   wherein the controllable frequency divider is switched into the feedback path of the two-point modulation phase-locked loop to generate a feedback signal based on an output signal of a controlled oscillator; and
   wherein the two-point modulation phase-locked loop is implemented to generate a control signal for the, controlled oscillator depending on the feedback signal and a reference frequency.

11. The two-point polar modulator according to claim 10, wherein the two-point modulation phase-locked loop comprises a voltage-controlled oscillator;
   wherein the voltage-controlled oscillator comprises a first control input and a second control input, and is implemented to generate the output signal depending on a combination of a first voltage signal applied to the first control input and a second voltage signal applied to the second control input;
   wherein the first voltage signal is derived from the control signal, and wherein the second voltage signal is based on the second control value.

12. The two-point polar modulator according to claim 11, wherein the two-point modulation phase-locked loop further comprises a charge pump and a smoothing filter to amplify the control signal using the charge pump and smooth the same using the smoothing filter to generate the first voltage signal from the control signal.

13. The two-point polar modulator according to claim 10, wherein the two-point modulation phase-locked loop comprises a digitally controlled oscillator;
   wherein the digitally controlled oscillator comprises a control input to generate the output frequency depending on a control signal applied to the control input, and
   wherein the two-point modulation phase-locked loop further comprises an addition member to generate the control signal from an additive overlay of a signal derived from the control signal and a signal based on the second control value.

14. The two-point polar modulator according to claim 13, wherein the two-point modulation phase-locked loop further comprises:
   a time-digital converter; and
   a digital filter,
   wherein the time-digital converter is implemented to generate a digital control signal representing the control signal depending on the modulated frequency and the reference frequency;
   wherein the digital filter is implemented to generate the signal derived from the control signal from the digital control signal.

15. The two-point polar modulator according to claim 1, wherein the control value generator further comprises:
   an AM compensation path,
   the AM compensation path comprising an amplification, a delay and a prefilter to amplify a signal based on the amplitude information using the amplification, delay the same using the delay and prefilter the same using the prefilter, to generate the signal derived from the amplitude information from the signal based on the amplitude information.

16. The two-point polar modulator according to claim 15, wherein the amplification and the delay are adjustable and the prefilter comprises adjustable prefilter coefficients.

17. The two-point polar modulator according to claim 15, wherein the control value generator is implemented to generate the signal derived from the amplitude information such that it virtually comprises the same frequency response as the interference effect acting on the two-point modulation phase-locked loop.

18. The two-point polar modulator according to claim 1, wherein the two-point modulation phase-locked loop further comprises a frequency divider with a fixed division factor to divide the frequency using the frequency divider with the fixed division factor by the fixed division factor to generate a fixedly divided frequency, and wherein the two-point modulation phase-locked loop is implemented to provide the phase-locked loop output signal depending on the fixedly divided frequency.

19. The two-point polar modulator according to claim 18, wherein the fixed division factor takes the value of 2 or 4.

20. The two-point polar modulator according to claim 1, wherein the two-point polar modulator further comprises:
   a shaping filter;
   a sigma/delta converter;
   a D/A conversion means; and
   an AM path filter,
   wherein the shaping filter is implemented to shape-filter the frequency signal using the shaping filter to generate the signal derived from the frequency signal from the frequency signal;
   wherein the sigma/delta converter is implemented to sigma/delta-convert the first control value signal using the sigma/delta converter to generate the first control value from the first control value signal;
   wherein the D/A conversion means comprises a D/A converter and a smoothing filter and is implemented to digital/analog-convert and smooth the second control value signal to generate the second voltage signal from the second control value signal;
   wherein the AM path filter comprises a first delay member, an oversampler, a second delay member a D/A converter and a smoothing filter, and wherein the AM path filter is implemented to delay a signal based on the amplitude information using the first delay member, oversample the same using the oversampler, delay the same using the second delay member, digital/analog-convert the same using the D/A converter and smooth the same using the smoothing filter, to derive the amplitude signal from the signal based on the amplitude information.

21. A two-point polar modulator for generating a polar-modulated signal based on amplitude information and phase information, comprising:
   a two-point modulation phase-locked loop which is implemented to enable a frequency setting depending on a first control value via a feedback path of the two-point modulation phase-locked loop, and to enable a frequency setting depending on a second control value, directly, bypassing the feedback path, wherein the two-point modulation phase-locked loop is implemented to provide a phase-locked loop output signal depending on the two control values;
   a modulation means which is implemented to combine an amplitude signal derived from the amplitude information with the phase-locked loop output signal to generate the polar-modulated signal; and
   a control value generator which is implemented to generate the first control value depending on the phase information and independent of the amplitude information, and which is implemented to generate the second control value depending on a signal derived from the amplitude information, wherein the control value generator comprises an amplification, a delay and a prefilter to amplify a signal based on the amplitude information using the amplification, delay the same using the delay and prefilter the same using the prefilter, to determine the signal derived from the amplitude information from the signal based on the amplitude information.

22. A mobile telephone, comprising:

a two-point polar modulator for generating a polar-modulated signal based on an amplitude information and a phase information, comprising:

a two-point modulation phase-locked loop which is implemented to enable a frequency setting depending on a first control value via a feedback path of the two-point modulation phase-locked loop, and to enable a frequency setting depending on a second control value, directly, bypassing the feedback path, wherein the two-point modulation phase-locked loop is implemented to provide a phase-locked loop output signal depending on the two control values;

a modulation means which is implemented to combine an amplitude signal derived from the amplitude information with the phase-locked loop output signal in order to generate the polar-modulated signal; and a control value generator which is implemented to generate the first control value depending on the phase information and independent of the amplitude information, and which is implemented to generate the second control value depending on the amplitude information;

a power amplifier for amplifying the polar-modulated signal; and a printed circuit board, wherein the two-point polar modulator and the power amplifier are arranged together on the printed circuit board;

wherein the power amplifier is implemented to generate a power output signal based on the polar-modulated signal.

23. A mobile telephone, comprising:

a two-point polar modulator for generating a polar-modulated signal based on amplitude information and phase information, comprising:

a two-point modulation phase-locked loop which is implemented to enable a frequency setting depending on a first control value via a feedback path of the two-point modulation phase-locked loop, and to enable a frequency setting depending on a second control value, directly, bypassing the feedback path, wherein the two-point modulation phase-locked loop is implemented to provide a phase-locked loop output signal depending on the two control values;

a modulation means which is implemented to combine an amplitude signal derived from the amplitude information with the phase-locked loop output signal to generate the polar-modulated signal; and a control value generator which is implemented to generate the first control value depending on the phase information and independent of the amplitude information, and which is implemented to generate the second control value depending on a signal derived from the amplitude information, wherein the control value generator comprises an amplification, a delay and a prefilter to amplify a signal based on the amplitude information using the amplification, delay the same using the delay and prefilter the same using the prefilter, to determine the signal derived from the amplitude information from the signal based on the amplitude information;

a power amplifier for amplifying the polar-modulated signal; and a printed circuit board, wherein the two-point polar modulator and the power amplifier are arranged together on the printed circuit board;

wherein the power amplifier is implemented to generate a power output signal based on the polar-modulated signal.

24. The mobile radio telephone according to claim 23, wherein the printed circuit board comprises no separate shielding chambers for the two-point polar modulator and the power amplifier;

wherein the two-point polar modulator is implemented to counteract an interference effect of the power output signal on the two-point polar modulator using a two-point modulation phase regulation.

25. A method for generating a polar-modulated signal based on an amplitude information and a phase information, the method comprising:

providing an output signal using a two-point modulation phase regulation, wherein a frequency of the output signal is settable depending on a first control value via a feedback of the two-point modulation phase regulation and depending on a second control value, directly, bypassing the feedback;

combining an amplitude signal derived from the amplitude information with the output signal to acquire the polar-modulated signal; and generating the first control value depending on the phase information and independent of the amplitude information; and generating the second control value depending on the amplitude information.

26. A two-point polar modulation means for generating a polar-modulated signal based on an amplitude information and a phase information, comprising:

a means for providing an output signal using a two-point modulation phase regulation, wherein a frequency of the output signal is settable depending on a first control value via a feedback of the two-point modulation phase regulation and depending on a second control value, directly, bypassing the feedback;

a means for combining an amplitude signal derived from the amplitude information with the output signal to acquire the polar-modulated signal; and a means for generating the first control value depending on the phase information and independent of the amplitude information; and for generating the second control value depending on the amplitude information.

27. A computer program comprising a program code this is stored on a non-transitory machine readable carrier for executing a method for generating a polar-modulated signal based on an amplitude information and a phase information, the method comprising: providing an output signal using a two-point modulation, phase regulation, wherein a frequency of the output signal is settable depending on a first control value via a feedback of the two-point modulation phase regulation and depending on a second control value, directly, bypassing the feedback; combining an amplitude signal derived from the amplitude-information with the output signal to acquire the polar-modulated signal; and generating the first control value depending on the phase information and independent of the amplitude information; and generating the second control value depending on the amplitude information, when the computer program is executed on a computer.

28. The two-point polar modulator according to claim 1, wherein the amplitude signal is an amplitude modulation signal.

29. The two-point polar modulator according to claim 1, wherein the second control value is derived from a signal derived from the amplitude information and a signal derived from the phase information.

30. The two-point polar modulator according to claim 29, wherein the signal derived from the amplitude information is subtracted from the signal derived from the phase information.

31. The mobile radio telephone according to claim 22, wherein the printed circuit board comprises no separate shielding chambers for the two-point polar modulator and the power amplifier;
    wherein the two-point polar modulator is implemented to counteract an interference effect of the power output signal on the two-point polar modulator using a two-point modulation phase regulation.

* * * * *